(12) United States Patent
Brown et al.

(10) Patent No.: US 8,674,047 B2
(45) Date of Patent: Mar. 18, 2014

(54) DOPING CONJUGATED POLYMERS AND DEVICES

(75) Inventors: Christopher T. Brown, Pittsburgh, PA (US); Mark A. Bower, Pittsburgh, PA (US); Venkataramanan Seshadri, Monroeville, PA (US)

(73) Assignee: Plextronics, Inc., Pittsburgh, PA (US)

( * ) Notice: Subject to any disclaimer, the term of this patent is extended or adjusted under 35 U.S.C. 154(b) by 79 days.

(21) Appl. No.: 13/104,598

(22) Filed: May 10, 2011

(65) Prior Publication Data

US 2011/0278559 A1 Nov. 17, 2011

Related U.S. Application Data

(66) Substitute for application No. 61/446,974, filed on Feb. 25, 2011.

(60) Provisional application No. 61/333,657, filed on May 11, 2010.

(51) Int. Cl.
  *C08G 79/08* (2006.01)
  *C08G 79/00* (2006.01)

(52) U.S. Cl.
  USPC .................. 528/8; 528/4; 528/373; 528/377; 528/397; 528/482

(58) Field of Classification Search
  USPC ............................ 528/4, 8, 373, 377, 397, 482
  See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 4,737,557 A | 4/1988 | Sato et al. | |
| 4,909,959 A | 3/1990 | Lemaire et al. | |
| 5,047,687 A | 9/1991 | VanSlyke | |
| 5,247,190 A | 9/1993 | Friend et al. | |
| 5,401,827 A | 3/1995 | Holmes et al. | |
| 5,454,880 A | 10/1995 | Sariciftci et al. | |
| 5,853,906 A | 12/1998 | Hsieh | |
| 5,999,780 A | 12/1999 | Mort et al. | |
| 6,166,172 A | 12/2000 | McCullough et al. | |
| 6,602,974 B1 | 8/2003 | McCullough et al. | |

(Continued)

FOREIGN PATENT DOCUMENTS

| | | |
|---|---|---|
| EP | 1725079 A1 | 11/2006 |
| EP | 2360162 A1 | 8/2011 |

(Continued)

OTHER PUBLICATIONS

Nielsen, et al., "Discrete Photopatternable π-Conjugated Oligomers for Electrochromic Devices," J. Am. Chem. Soc., ( 2008)vol. 130, No. 30, pp. 9734-9746.

(Continued)

*Primary Examiner* — Duc Truong
(74) *Attorney, Agent, or Firm* — The Marbury Law Group, PLLC

(57) ABSTRACT

Compositions comprising at least one hole transport material, such as a conjugated polymer, and at least one dopant, providing improved thermal stability. Compositions can be applied to substrates and used in HIL and HTL layers and organic electronic devices such as light emitting devices such as OLEDs or OPVs. The conjugated polymer can be a polythiophene, including a 3,4-substituted polythiophene or a regioregular polythiophene. The dopant can be a silver salt such as silver tetrakis(pentafluorophenyl)borate. Improved methods of making dopant are provided.

40 Claims, 3 Drawing Sheets

(56) References Cited

U.S. PATENT DOCUMENTS

| | | | |
|---|---|---|---|
| 6,812,399 | B2 | 11/2004 | Shaheen et al. |
| 6,933,436 | B2 | 8/2005 | Shaheen et al. |
| 7,070,867 | B2 | 7/2006 | Thompson et al. |
| 7,569,159 | B2 | 8/2009 | Hammond et al. |
| 7,785,740 | B2 | 8/2010 | Amine et al. |
| 2004/0113127 | A1 | 6/2004 | Min et al. |
| 2005/0123793 | A1 | 6/2005 | Thompson et al. |
| 2005/0147846 | A1 | 7/2005 | Marks et al. |
| 2006/0076050 | A1 | 4/2006 | Williams et al. |
| 2006/0078761 | A1 | 4/2006 | Williams et al. |
| 2006/0175582 | A1 | 8/2006 | Hammond et al. |
| 2007/0207341 | A1 | 9/2007 | Iida et al. |
| 2008/0102279 | A1 | 5/2008 | Ito et al. |
| 2008/0248313 | A1 | 10/2008 | Seshadri et al. |
| 2009/0256117 | A1 | 10/2009 | Seshadri et al. |
| 2010/0010900 | A1 | 1/2010 | Lee et al. |
| 2010/0108954 | A1 | 5/2010 | Benson-Smith et al. |
| 2010/0292399 | A1 | 11/2010 | Brown et al. |

FOREIGN PATENT DOCUMENTS

| | | | |
|---|---|---|---|
| WO | WO-2008/073149 | A2 | 6/2008 |
| WO | WO-2009/102027 | A1 | 8/2009 |
| WO | WO-2009/111339 | A1 | 9/2009 |
| WO | WO-2009/111675 | A1 | 9/2009 |
| WO | WO-2009/126918 | A1 | 10/2009 |
| WO | WO-2009/152165 | A2 | 12/2009 |
| WO | WO-2009/158069 | A1 | 12/2009 |

OTHER PUBLICATIONS

Fukase, et al., "High-efficiency Organic Electroluminescent Devices Using Iridium Complex Emitter and Arylamine-containing Polymer Buffer Layer," Polymers for Advanced Technologies, (2002) vol. 13, pp. 601-604.

Friend, et al., "Polymer LEDs," Physics World, Nov. 1992, vol. 5, No. 11, 42-46.

Kraft, et al., "Electroluminescent Conjugated Polymers-Seeing Polymers in a New Light," Angew. Chem. Int. Ed. 1998, 37, 402-428.

Li and Meng (Eds.),Organic Light-Emitting Materials and Devices, 2007, CRC Press—Taylor & Francis, Boca Raton, FL.

Kroschwitz (Ed.), Concise Encyclopedia of Polymer Science and Engineering, Wiley & Sons, 1990, pp. 298-300, USA.

McCullough, "The Chemistry of Conducting Polythiophenes," Adv. Mater. 1998, 10, No. 2, pp. 93-116, Wiley-VCH, Verlag GmbH Weinheim, Germany.

Handbook of Conducting Polymers, $2^{nd}$ Ed. 1998, Chapter 9, by McCullough et al., "Regioregular, Head-to-Tail Coupled Poly(3-alkylthiophene) and its Derivatives," pp. 225-258.

Friend, et al., "Electroluminescence in Conjugated Polymers," pp. 823-846, Handbook of Conducting Polymers, $2^{nd}$ Ed. 1998, chapter 29.

Roncali "Conjugated Poly(thiophenes): Synthesis, Functionalization, and Applications," Chemical Reviews 1992, vol. 92, No. 4, 711-738.

Schopf, et al., Polythiophenes—Electrically Conductive Polymers, Springer: Berlin, Germany, 1997.

Katz, et al., "Synthetic Chemistry for Ultrapure, Processable, and High-Mobility Organic Transistor Semiconductors," Accounts of Chemical Research, vol. 34, No. 5, 2001, p. 359 and pp. 365-367.

Noshay and McGrath, Block Copolymers, Overview and Critical Survey, Academic Press, 1977, Chapters 5, 6 and 7, New York.

Francois, et al., "Block-copolymers with conjugated segments: Synthesis and structural characterization," Synthetic Metals, (1995) 69, 463-466.

Yang, et al., "A Soluble Blue-Light-Emitting Polymer," Macromolecules 1993, 26, 1188-1190, Communications to the Editor.

Widawski, et al., "Self-organized honeycomb morphology of star-polymer polystyrene films," Nature, vol. 369, Jun. 2, 1994, 387-389.

Jenekhe, et al., "Self-Assembled Aggregates of Rod-Coil Block Copolymers an Their Solubilization and Encapsulation of Fullereness," Science, vol. 279, Mar. 20, 1998, 1903-1907.

Wang, et al., "Syntheses of Amphiphilic Diblock Copolymers Containing a Conjugated Their Self-Assembling Properties," J. Am. Chem. Soc. 2000, vol. 122, No. 29, 6855-6861.

Li, et al., "Syntheses of Oligphenylenevinylenes-Polyisoprene Diblock Copolymers and Their Microphase Separation," Macromolecules 1999, vol. 32, No. 9, 3034-3044.

Hempenius, et al., "A Polystyrene-Oligothiophene-Polystyrene Triblock Copolymer," J. Am. Chem. Soc. 1998, vol. 120, No. 12, 2798-2804.

Campos, et al., "Photovoltaic Activity of a PolyProDOT Derivative in a Bulk Heterojunction Solar Cell", Solar Energy Materials & Solar Cells, 90 (2006) 3531-3546.

Lebedev, et al., "Solvato-Controlled Doping of Conducting Polymers," Chem. Mater., 1998, vol. 10, No. 1, 156-163.

Hijazi, et al., "Synthesis and Characterization of Acetonitrile-Ligated Transition-Metal Complexes with Tetrakis(pentafluorophenyl)borate as Counteranions," European J. Inorganic Chemistry, (2008), vol. 2008, No. 18, pp. 2892-2898.

Ogawa, et al., "Synthesis and Structure of a New Tetrakis(pentafluorophenyl)borate Salt of the Silver (I) Cation with Novel Trigonal Planar Tris(benzene) Coordination," Organometallics, 2005, vol. 24, No. 20, pp. 4842-4844.

Kuprat, et al., "Synthesis of Pentafluorophenyl Silver by Means of Lewis Acid Catalysis: Syructure of Silver Solvent Complexes," Organometallics, 2010, vol. 29, No. 6, pp. 1421-1427.

Cheremisinoff, N.P, Industrial Solvents Handbook, $2^{nd}$ Ed. (Marcel Dekker, New York, 2003).

Ash, Michael and Irene, Handbook of Solvents, $2^{nd}$ Ed. (Synapse Information Resources, 2003).

Wypych, G. (ed.), Handbook of Solvents, (ChemTec Publishing, Toronto Canada, 2001).

Hansen, Hansen Solubility Parameters: A User's Handbook, second edition, CRC Press(Taylor and Francis Group LLC, 2007), Boca Raton, Florida.

Brédas and Silbey, (eds.), Conjugated Polymers: The Novel Science and Technology of Highly Conducting Nonlinear Optically Active Materials, Kluwer Academic Publishers, Dordrecht, The Netherlands (1991).

Wienk, et al., "Low-band gap poly(di-2-thienylthienopyrazine):fullerene solar cells," Applied Physics Letters, 88, 153511 (2006).

Vignali, et al., "Electropolymerized polythiophene layer extracted from the interface between two immiscible electrolyte solutions: Current-time analysis," Journal of Electroanalytical Chemistry, (2006), vol. 591, pp. 59-68, XP025157898.

Search Report in International Application PCT/US2011/035897 mailed Oct. 27, 2011.

DOPING CONJUGATED POLYMERS AND DEVICES

RELATED APPLICATIONS

This application claims priority to U.S. provisional application 61/333,657 filed May 11, 2010 which is hereby incorporated by reference in its entirety for all purposes. This application also claims priority to U.S. provisional application 61/446,974 filed Feb. 25, 2011 which is also hereby incorporated by reference in its entirety for all purposes.

BACKGROUND

Although useful advances are being made in energy saving devices such as, for example, organic-based organic light emitting diodes (OLEDs), polymer light emitting diodes (PLEDs), phosphorescent organic light emitting diodes (PHOLEDs), and organic photovoltaic devices (OPVs), further improvements are still needed in providing better processing and performance for commercialization. For example, one promising type of material are the conducting polymers including, for example, polythiophenes. However, problems can arise with doping, purity, solubility, processing, and instability. Also, it is important to have very good control over the solubility of alternating layers of polymer (e.g., orthogonal or alternating solubility properties among adjacent layers). In particular, for example, hole injection layers and hole transport layers can present difficult problems in view of competing demands and the need for very thin, but high quality, films.

A need exists for a good platform system to control properties of hole injection and transport layers such as solubility, thermal stability, and electronic energy levels such as HOMO and LUMO, so that the materials can be adapted for different applications and to function with different materials such as light emitting layers, photoactive layers, and electrodes. In particular, good solubility, intractability, and thermal stability properties are important. The ability to formulate the system for a particular application and provide the required balance of properties are also important.

SUMMARY

Embodiments described herein include, for example, compositions, methods of making the compositions, and methods of using the compositions, including uses in devices and articles. Compositions include, for example, polymers, monomers, blends, films, dispersions, solutions, powders, and ink formulations. Other embodiments include methods of making and methods of using devices.

For example, one embodiment provides a composition comprising: a reaction product of: (i) at least one conjugated polymer, wherein the conjugated polymer comprises at least one polythiophene comprising an alkoxy substituent at either the 3-position or the 4-position, or both; and (ii) at least one dopant for polymer (i) comprising an ionic compound, wherein the cation of the ionic compound is V, Cr, Mn, Fe, Co, Ni, Cu, Nb, Mo, Tc, Ru, Rh, Pd, Ag, Ta, W, Re, Os, Ir, Pt, or Au; and an anion of the ionic compound is represented by at least one of the following structures:

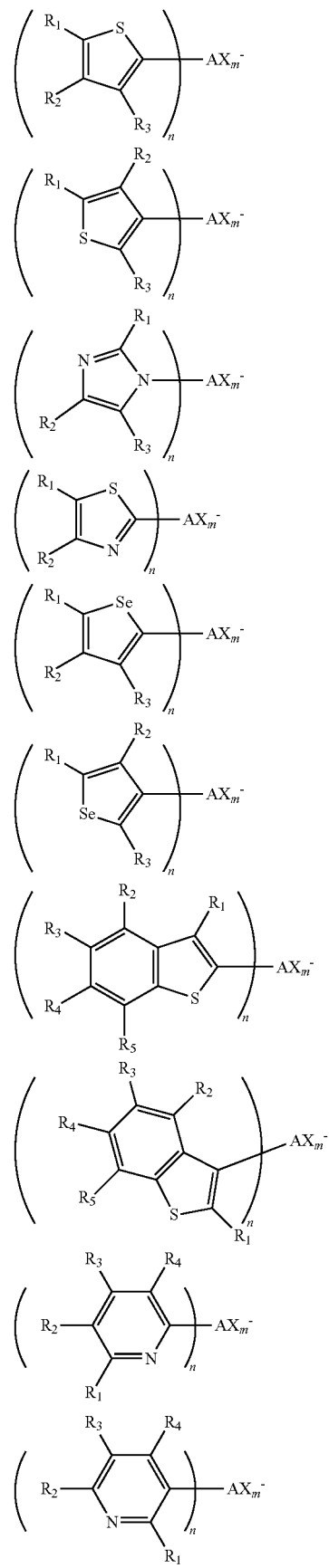

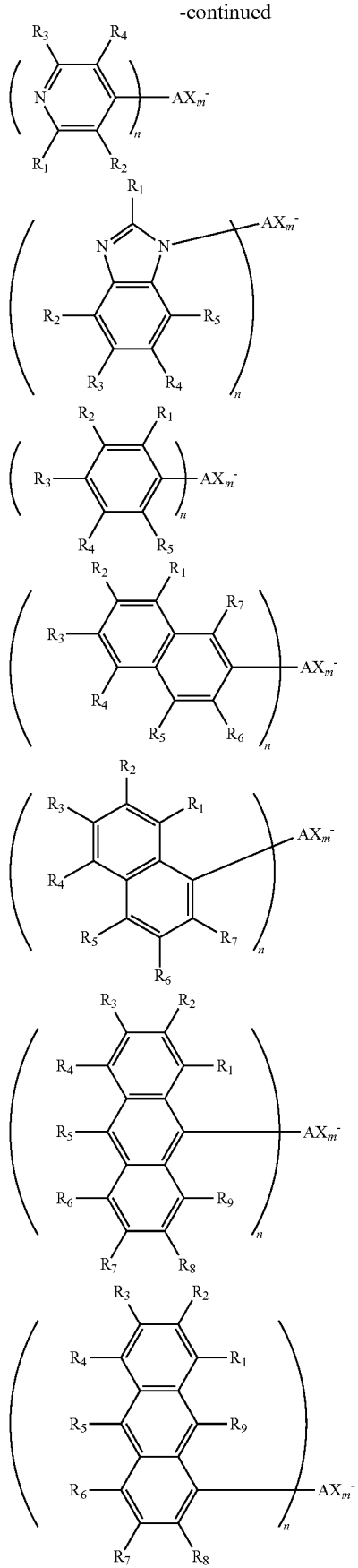
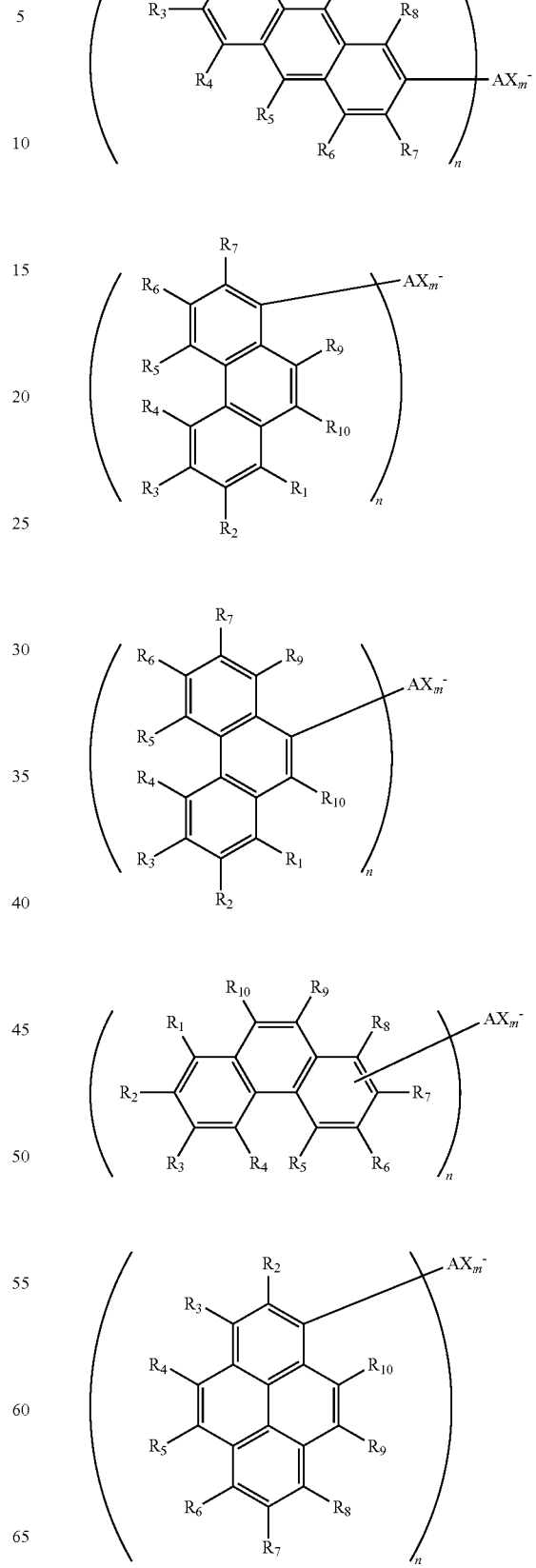

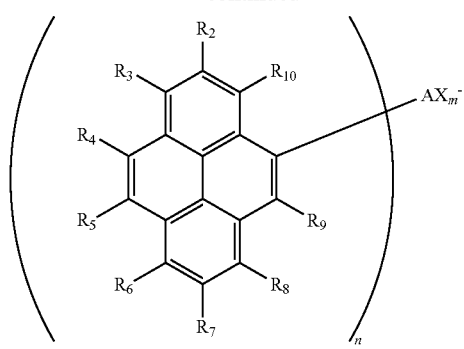

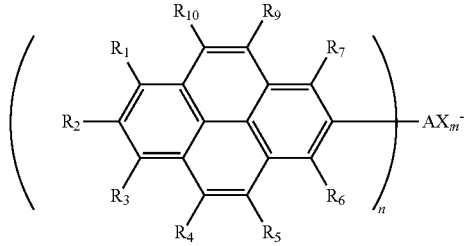

wherein independently, each of $R_1$ to $R_{10}$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, antimony, $SO_3$ or $CO_2$; X is F, Cl, Br, I or CN; n is 0 to 6; and m is ≤6-n; wherein the composition further optionally comprises at least one matrix material different than (i). In one embodiment, n can be 1 to 6. In one embodiment, the matrix material is present.

Another embodiment provides a composition comprising: a reaction product of (i) at least one hole transport material, and (ii) at least one silver tetrakis(halogenatedaryl)borate dopant. In one embodiment, a matrix material is also present.

Another embodiment provides a composition comprising at least one solid powder, wherein the solid powder comprises a reaction product of: (i) at least one conjugated polymer, wherein the conjugated polymer comprises at least one polythiophene comprising an alkoxy substituent at either the 3-position or the 4 position or both; and (ii) at least one dopant for polymer (i) comprising an ionic compound, wherein the cation of the ionic compound compound is V, Cr, Mn, Fe, Co, Ni, Cu, Nb, Mo, Tc, Ru, Rh, Pd, Ag, Ta, W, Re, Os, Ir, Pt, or Au; and an anion of the ionic compound is represented by at least one of the following structures:

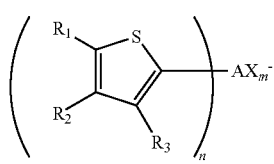

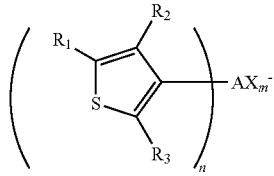

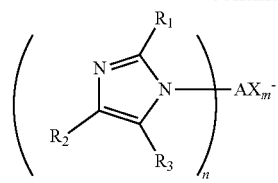

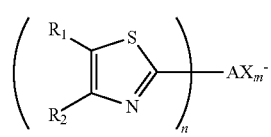

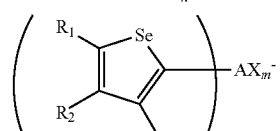

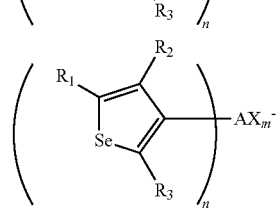

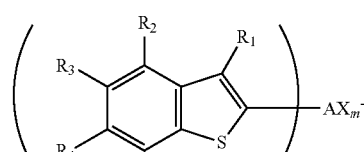

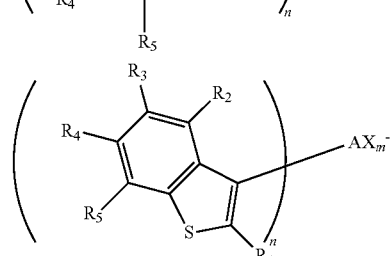

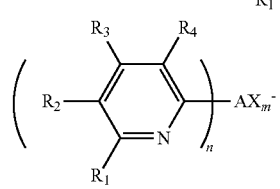

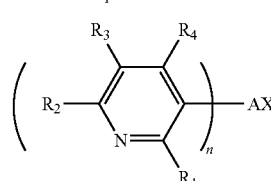

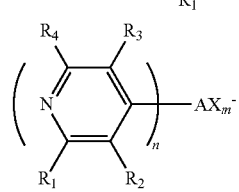

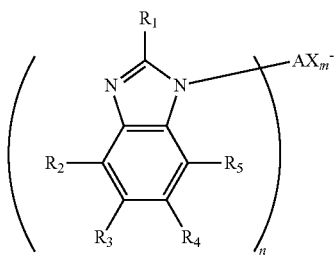
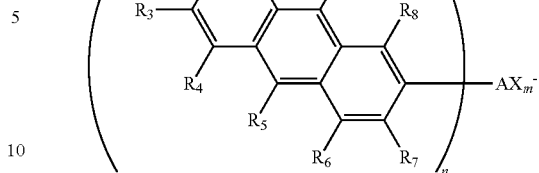
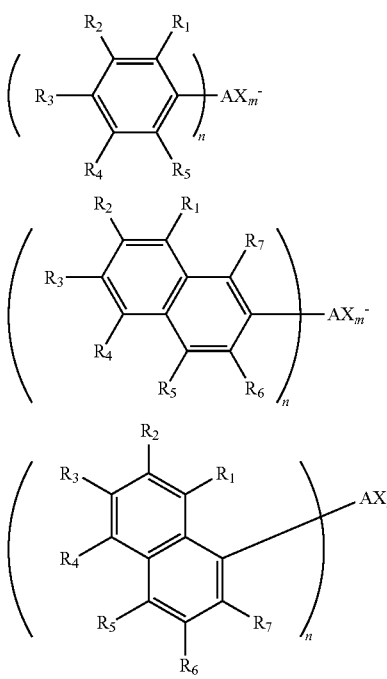
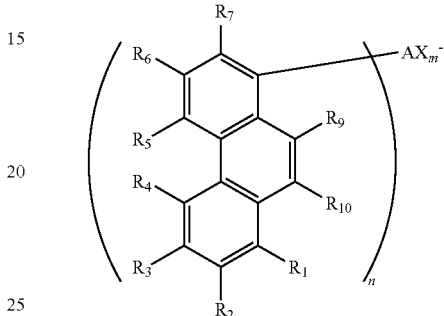
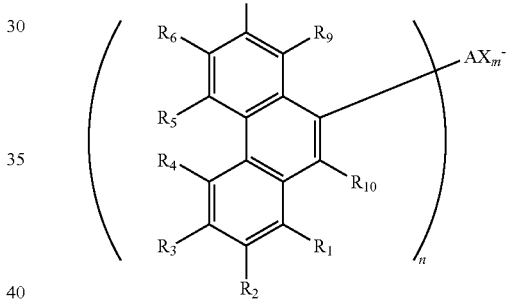
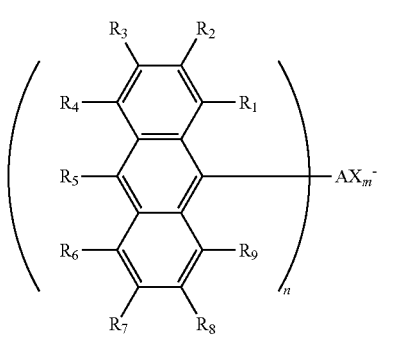
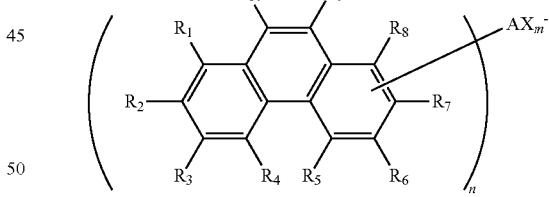
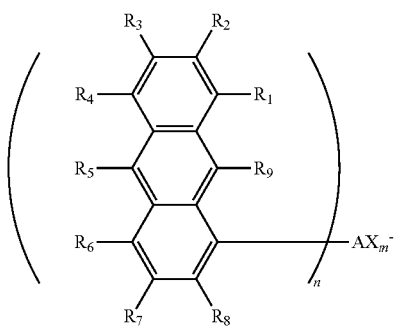
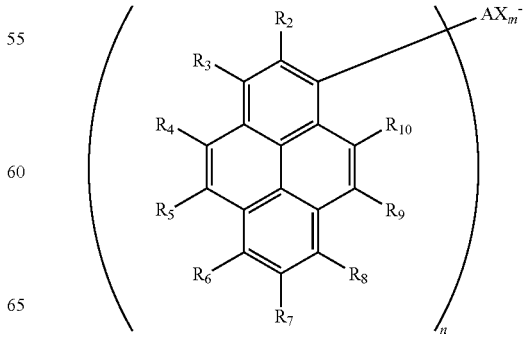

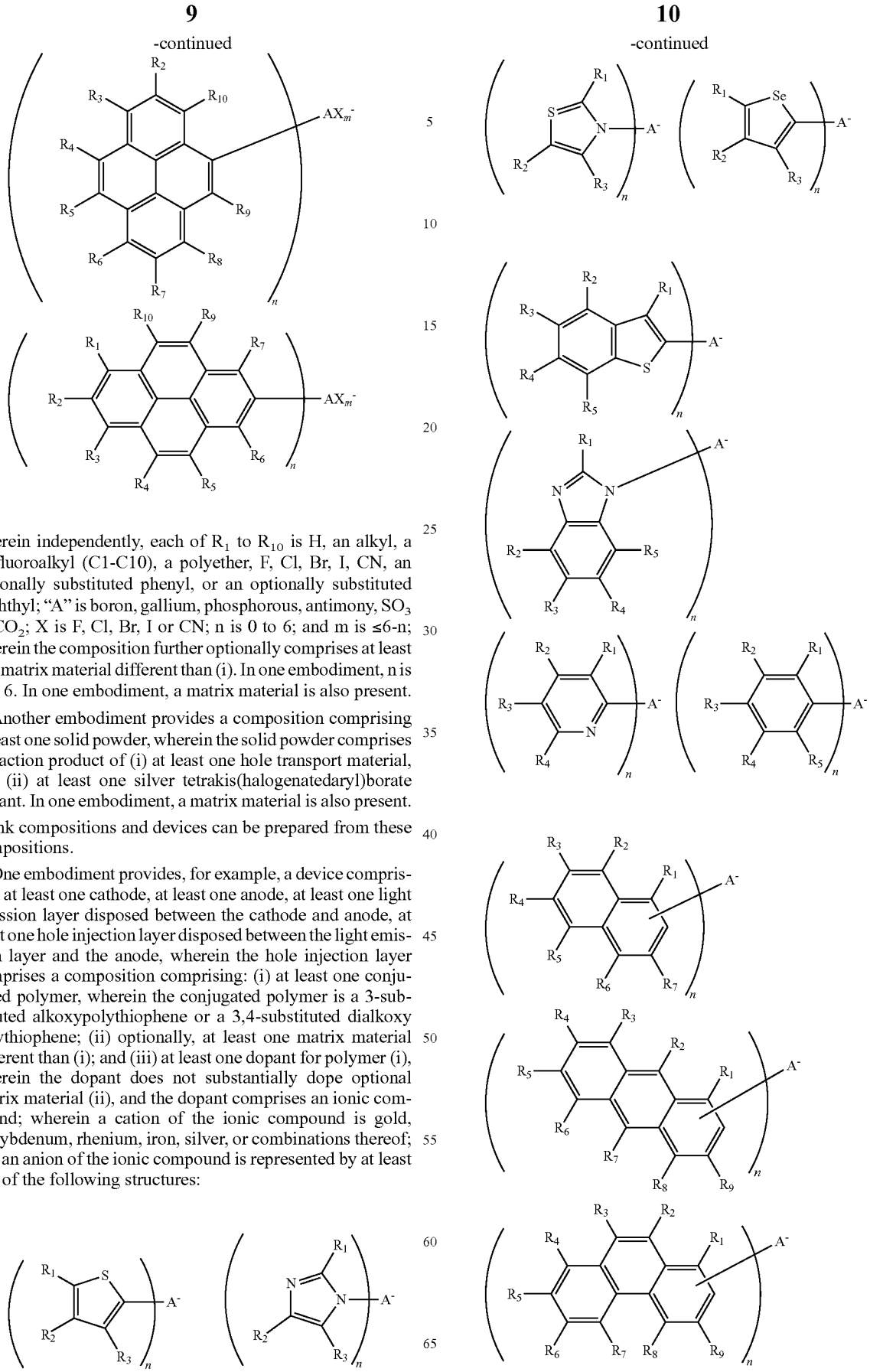

wherein independently, each of $R_1$ to $R_{10}$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, antimony, $SO_3$ or $CO_2$; X is F, Cl, Br, I or CN; n is 0 to 6; and m is ≤6-n; wherein the composition further optionally comprises at least one matrix material different than (i). In one embodiment, n is 0 to 6. In one embodiment, a matrix material is also present.

Another embodiment provides a composition comprising at least one solid powder, wherein the solid powder comprises a reaction product of (i) at least one hole transport material, and (ii) at least one silver tetrakis(halogenatedaryl)borate dopant. In one embodiment, a matrix material is also present.

Ink compositions and devices can be prepared from these compositions.

One embodiment provides, for example, a device comprising: at least one cathode, at least one anode, at least one light emission layer disposed between the cathode and anode, at least one hole injection layer disposed between the light emission layer and the anode, wherein the hole injection layer comprises a composition comprising: (i) at least one conjugated polymer, wherein the conjugated polymer is a 3-substituted alkoxypolythiophene or a 3,4-substituted dialkoxy polythiophene; (ii) optionally, at least one matrix material different than (i); and (iii) at least one dopant for polymer (i), wherein the dopant does not substantially dope optional matrix material (ii), and the dopant comprises an ionic compound; wherein a cation of the ionic compound is gold, molybdenum, rhenium, iron, silver, or combinations thereof; and an anion of the ionic compound is represented by at least one of the following structures:

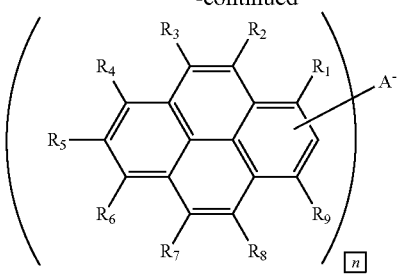

wherein independently, each of $R_1$ to $R_9$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, or antimony; and n is 1 to 6 in each of the twelve structures.

Another embodiment provides, for example, a device comprising: at least one cathode, at least one anode, at least one light emission layer disposed between the cathode and anode, at least one hole injection layer disposed between the light emission layer and the anode, wherein the hole injection layer comprises a composition comprising: (i) at least one conjugated polymer, (ii) optionally, at least one matrix material different than (i); and (iii) at least one dopant for polymer (i), wherein the dopant does not substantially dope optional matrix material (ii), and the dopant increases the thermal stability of the HIL layer.

Still further, another embodiment provides a composition comprising: (i) at least one conjugated polymer, wherein the conjugated polymer is a 3-substituted alkoxypolythiophene or a 3,4-substituted dialkoxy polythiophene; (ii) optionally, at least one matrix material different than (i); and (iii) at least one dopant for polymer (i), wherein the dopant does not substantially dope optional matrix material (ii), and the dopant comprises an ionic compound; and (iv) at least one solvent; wherein a cation or the ionic compound is gold, molybdenum, rhenium, iron, or silver; and an anion of the ionic compound is at least one organic structure represented by:

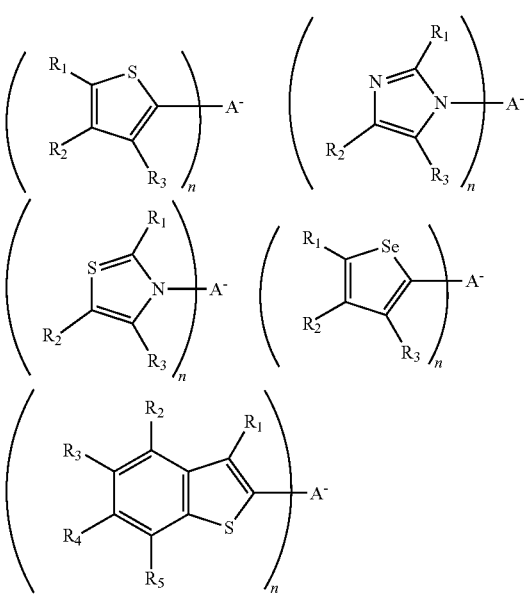

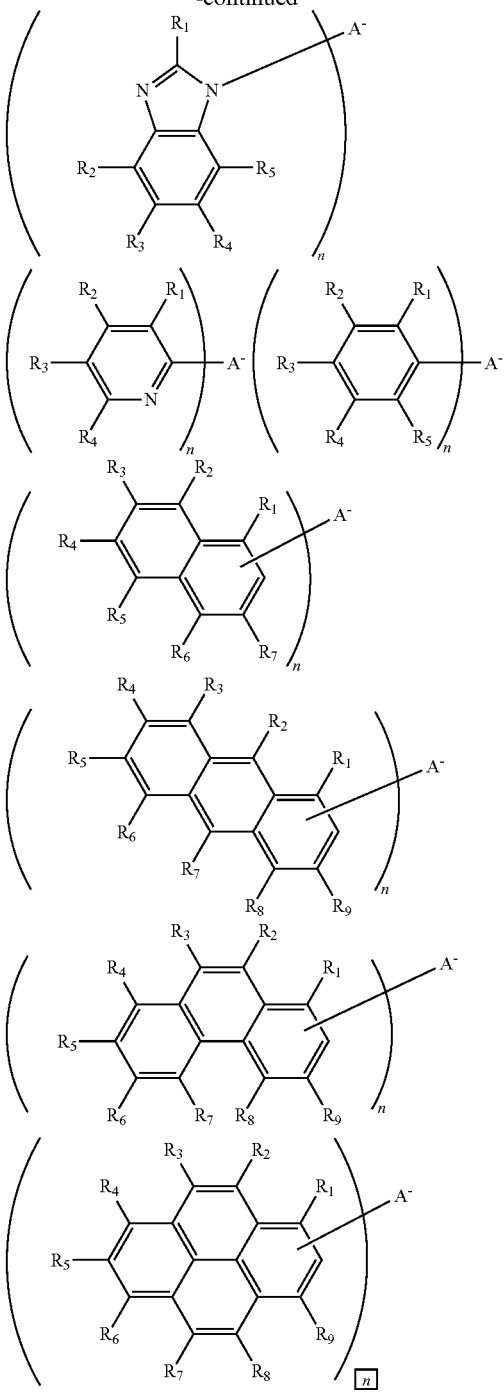

wherein independently, each of $R_1$ to $R_9$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, or antimony; and n is 1 to 6.

Another embodiment is a composition comprising: (i) at least one conjugated polymer, wherein the conjugated polymer is a 3-substituted alkoxypolythiophene or a 3,4-substituted dialkoxy polythiophene; (ii) optionally, at least one matrix material different than (i); and (iii) at least one dopant for polymer (i), wherein the dopant does not substantially dope optional matrix material (ii), and the dopant comprises an ionic compound; and wherein a cation of the ionic compound is gold, molybdenum, rhenium, iron, or silver; and an anion of the ionic compound is at least one organic structure represented by:

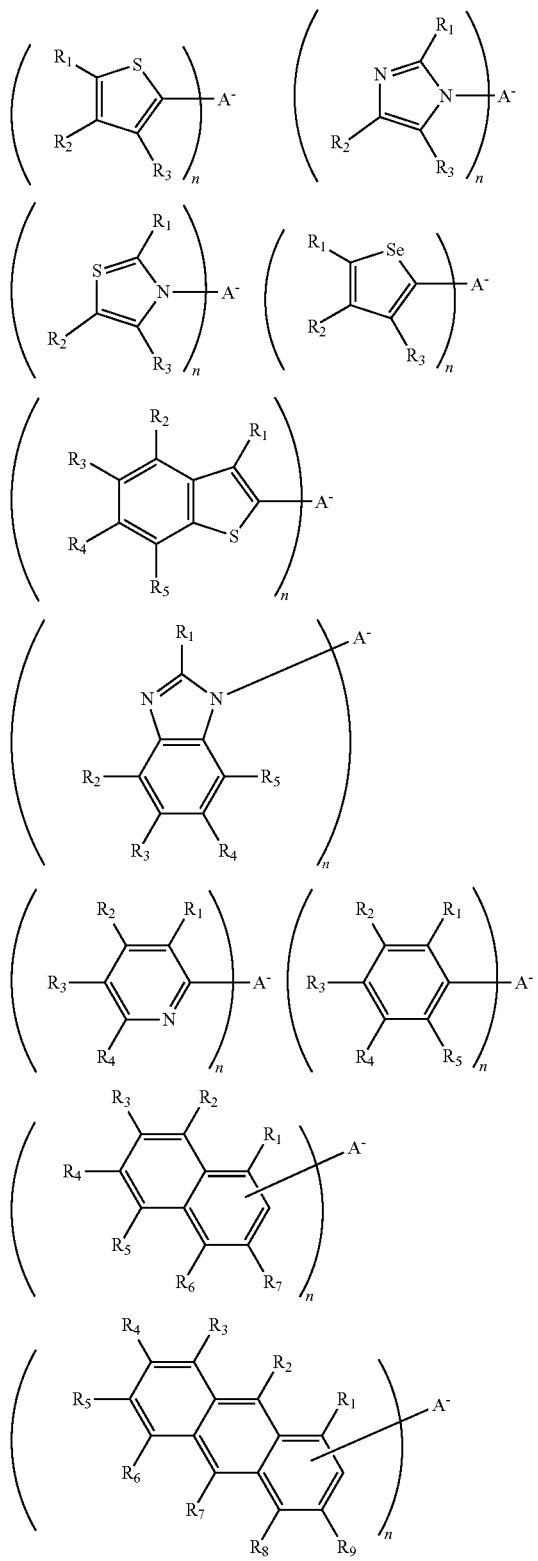

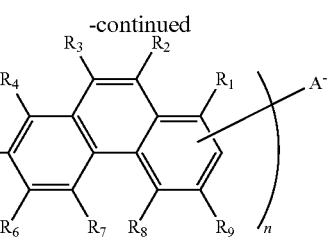

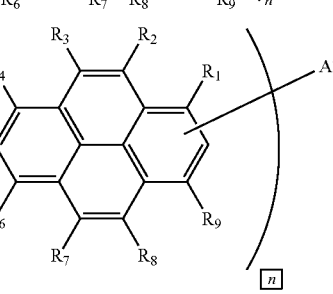

wherein independently, each of $R_1$ to $R_9$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, or antimony; and n is 1 to 6.

Furthermore, one embodiment provides, for example, a device comprising at least one cathode, at least one anode, at least one light emission layer disposed between the cathode and anode, at least one hole injection layer (HIL) disposed between the light emission layer and the anode, wherein the hole injection layer comprises a composition comprising: (i) at least one conjugated polymer, wherein the conjugated polymer is a 3-substituted alkoxypolythiophene or a 3,4-substituted dialkoxy polythiophene, (ii) optionally, at least one matrix material different than (i), and (iii) at least one dopant for polymer (i), wherein the dopant does not substantially dope the optional matrix material (ii), and the dopant comprises an ionic compound, including for example ionic compound compositions described herein. In another embodiment, the HIL layer does not comprise iodonium salt.

Another embodiment provides, for example, a device comprising at least one HIL that comprises at least one poly(3,4-dialkoxythiophene) doped with at least silver tetrakis(pentafluorophenyl)borate (anion: TPFB). Another embodiment provides, for example, a device comprising at least one HIL that comprises at least one poly(3-alkoxythiophene) doped with at least silver tetrakis(pentafluorophenyl)borate.

Another embodiment provides, for example, a composition comprising: (i) at least one conjugated polymer, wherein the conjugated polymer is a 3-substituted alkoxypolythiophene or a 3,4-substituted dialkoxy polythiophene, (ii) at least one matrix material different than (i), and (iii) at least one dopant for polymer (i), wherein the dopant does not substantially dope matrix material (ii), and the dopant comprises an ionic compound, and (iv) at least one solvent. In another embodiment, the at least one solvent may be optional. In another embodiment, the at least one dopant does not comprise an iodonium salt.

Another embodiment provides, for example, a composition comprising at least one poly(3,4-dialkoxythiophene) doped with at least silver tetrakis(pentafluorophenyl)borate. Another embodiment provides, for example, a composition comprising at least one poly(3-alkoxythiophene) doped with at least silver tetrakis(pentafluorophenyl)borate.

Other embodiments provide coated substrates. The substrate can be a flexible substrate, such as a polymer, or a rigid substrate, such as glass.

Other embodiments provide methods of making dopants, including, for example, silver tetrakispentafluorophenylborate by metathesis reaction.

At least one advantage from at least one embodiment described herein includes improvement in operational stability including, for example, long term stability and overall increased lifetime of an organic electronic device such as for example an OLED, PHOLED, or OPV device. In particular, improvements can be realized compared to use of PEDOT/PSS controls. In particular, properties such as current density and luminescence can be improved.

At least one additional advantage for at least one embodiment includes more flexibility in the formulation and building of an organic electronic device, such as for example an LED, OLED, PHOLED, OPV, electrochromic device, metal-metal oxide capacitors, supercapacitor, an actuator or transistor, seed-layer for printed circuit boards. In particular, films made from the compositions described herein, upon casting and annealing, can be intractable to toluene. In particular, the compositions described herein can be used when it is desirable to cast subsequent layers of emissive layers. Additionally, the intractability to toluene or other solvents can enable orthogonal compatibility necessary for all solution processed devices, and can be used to create solution processed devices.

At least one additional advantage for at least one embodiment includes doping of soluble conjugated polymers in a solvent system while maintaining the ability to process them from the same solution.

At least one additional advantage for at least one embodiment includes the doping of polythiophenes in solution which has been previously precluded because of its limited solubility in its doped form.

Another benefit of at least some embodiments described herein is the ability to form thick layers that allow for planarizing underlying transparent conducting oxides while maintaining overall transparency.

Another benefit of at least some embodiments described herein include improved thermal stability properties, such as improved thermochromism, or improved lack of thermochromism.

Another benefit of at least some embodiments described herein include the minimization or elimination of free radical generation during doping, which would otherwise lead to undesirable side-reactions that cause degradation.

Another benefit of at least some embodiments described herein include production of pure, doped conjugated polymers devoid of non-volatile residues.

Still further, another benefit for at least some embodiments can be that better dopant preparations, and more stable dopants, can be achieved.

DETAILED DESCRIPTION

Introduction

Figure 1:
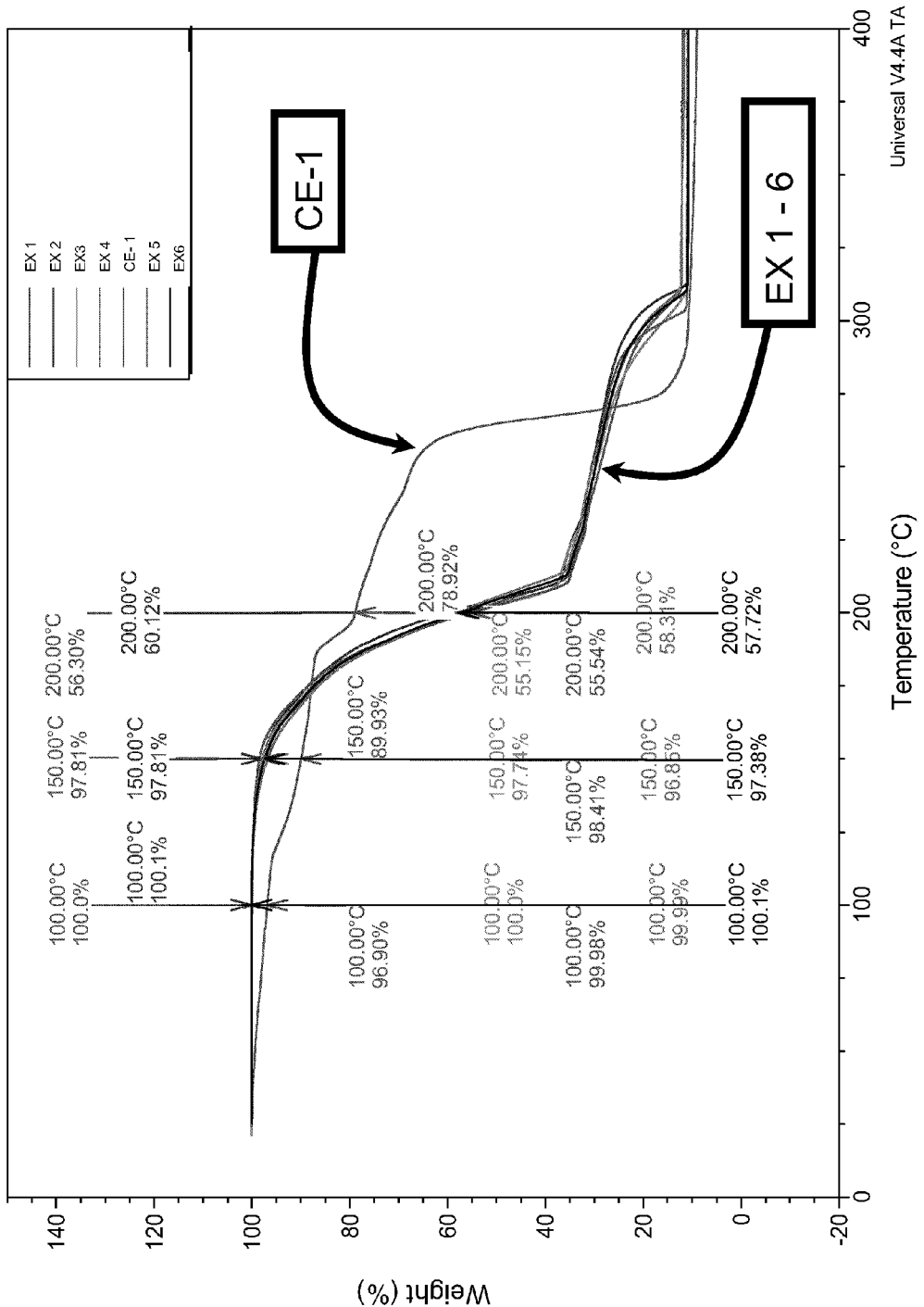
FIG. 1 illustrates thermogravimetric analysis of six exemplary samples, AgTPFB, and a comparative samples of LiTPFB.

All references cited herein are incorporated by reference in their entireties.

US Patent Publication 2009/0256117, filed Apr. 10, 2009 (assignee: Plextronics, Inc.) describes a series of polymers, doping systems, and devices, and is hereby incorporated by reference including its working examples, figures, conjugated polymers, dopants, and claims.

U.S. provisional application Ser. No. 61/287,977 filed Dec. 18, 2009 describes other useful embodiments for conjugated polymers, copolymers, and dopants.

U.S. Pat. No. 7,569,159 describes hole injection layer and hole transport layers and associated devices.

US Patent Publication 2008/0248313 (filed Jul. 13, 2007) described sulfonated materials used in hole injection layer and hole transport layers and associated devices.

US Patent Publications 2006/0078761 and 2006/0076050 (filed Sep. 26, 2005) describe conjugated polymers used in electroluminescent and photovoltaic devices.

Conjugated polymers used in organic electronic devices are also described in, for example, WO 2009/152,165 (published Dec. 17, 2009); WO 2009/111,675 (published Sep. 11, 2009); WO 2009/111,339 (published Sep. 11, 2009).

OLED displays and materials are described in, for example, *Organic Light-Emitting Materials and Devices*, Li and Meng (Eds.), 2006.

Other examples of organic materials and/or dopants include: EP 1725079; US 2007/0207341; WO 2009/102027; WO 2009/158069; U.S. Pat. No. 5,853,906; U.S. Pat. No. 5,999,780; and Nielsen et al., J. Am. Chem. Soc., 2008, 130, 9734-9746.

Doping of conjugated polymers, for example, polythiophenes in solution has often been precluded because of its limited solubility in its doped form. One solution is the use of a composition comprising a conjugated polymer and a metal salt dopant in which a spontaneous electron transfer from the polymer to the metal salt occurs. The result is a doped conjugated polymer, for example a polymer in its oxidized form, or a p-type conjugated polymer, with an associated anion and a free metal. Such a system can show increased thermochromic stability. While not being limited to any particular theory, the extent of color neutrality for the conjugated polymer in doped form, as a function of temperature, appears to be dependent on the anion part of the silver salt. For example, embodiments described herein, including tetrakis(pentafluorophenyl)borate anion, show marked improvement over other anions such as tetrafluoroborate, hexafluorophosphate, bis (trifluoromethanesulfonimide).

Conventional organic oxidants such as hypervalent iodonium, sulfonium or oxonium salts are not desirable for doping of conjugated polymers because they can generate free radical reactive species, which can lead to undesirable side-reactions and degradation. The use of dopants of at least one embodiment described herein yields only benign zero valent silver, which can be removed via simple filtration or sequestering process. Additionally, dopants of at least one embodiment described herein are aprotic and do not require additional acid to initiate doping of conjugated polymers.

Doping conjugated polymers with ammoniumyl salts like tris(4-bromophenyl)ammoniumyl hexachloroantimonate, as described in, for example, Kido et al., *Polymers for Advanced Technologies*, 2002, 13(8), 601, provide polymers with non-volatile residues such as tris(4-bromophenyl)amine, which may affect the performance of the HIL. These non-volatile residues remain in films formed from the doped conjugated polymers. However, the use of dopants of at least one embodiment described herein to dope conjugated polymers provides pure doped conjugated polymer devoid of non-volatile residues.

Hole Transporting Materials

Hole transporting materials are known in the art and are commercially available. They can be, for example, low molecular weight materials or high molecular weight materials. They can be conjugated polymers. For example, hole transporting materials can be linear conjugated polymers, conjugated polymer brushes, polymers which comprise hole transporting moieties in the main-chain or side chain, and cross-linkable and non-crosslinked small molecules. The structures described and illustrated herein can be incorporated into a polymer backbone or side chain.

Examples of hole transporting and/or conjugated polymers include, for example, polythiophenes, polypyrroles, polyfurans, polyselenophenes, polytellurophenes, polyanilines, polyarylamines, and polyarylenes (e.g., polyphenylenes, polyphenylene vinylenes, and polyfluorenes).

The number average molecular weight can be, for example, about 1,000 to about 500,000, or about 5,000 to about 100,000, or about 10,000 to about 50,000.

Some examples of polymeric hole transporting materials include:

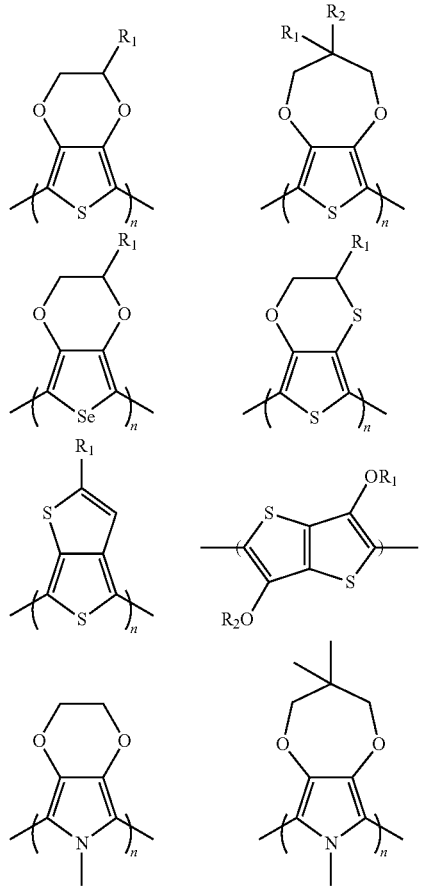

In the above structures, the groups R1 and R2 can be, independently of each other, known side groups including, for example, optionally substituted C1-C25 groups, or C2-C10 groups, including alkyl, alkoxy, and polyether groups. Other descriptions for the groups R1 and R2 are provided hereinbelow. The groups can be electron-withdrawing or electron-releasing groups. They also can be hydrogen. The side groups can provide solubility. The value of n can be, for example, 5-10,000, or 10-5,000, or 20-1,000.

Additional examples of hole transport materials include:

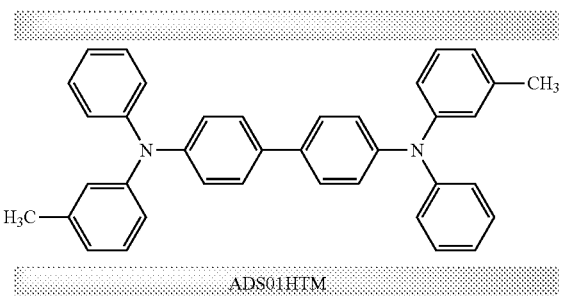

ADS01HTM

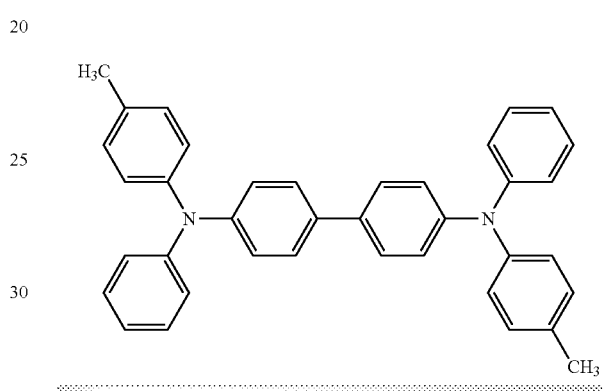

ADS02HTM

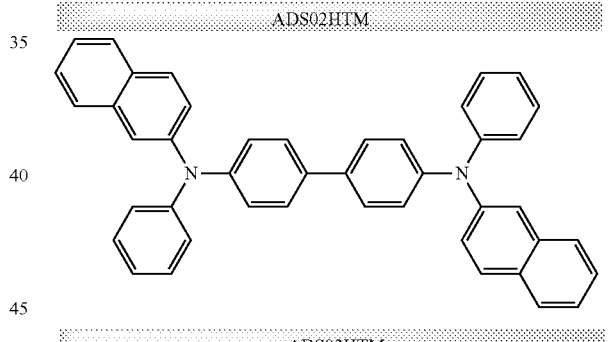

ADS03HTM

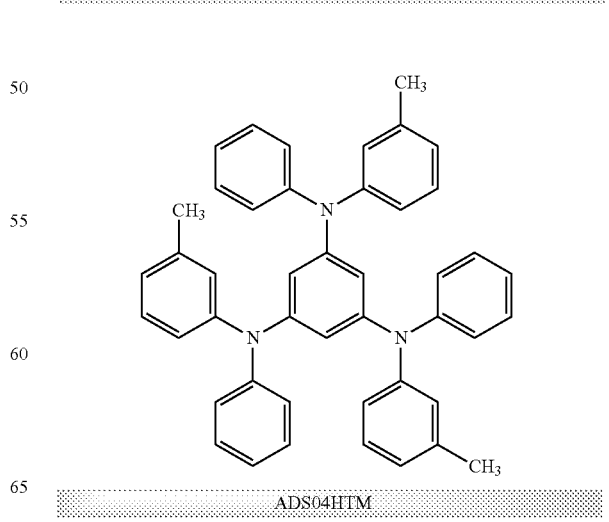

ADS04HTM

-continued
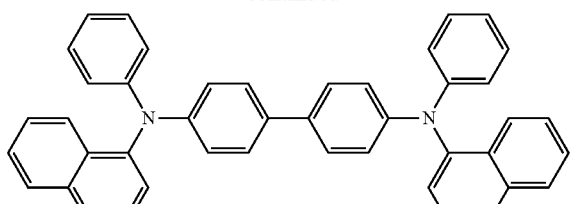
ADS05HTM
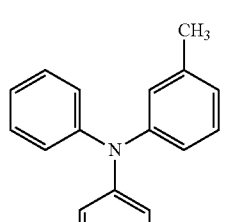
ADS09HTM
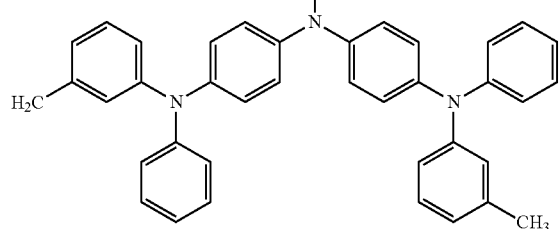
ADS12HTM
Hole Transport Polymers
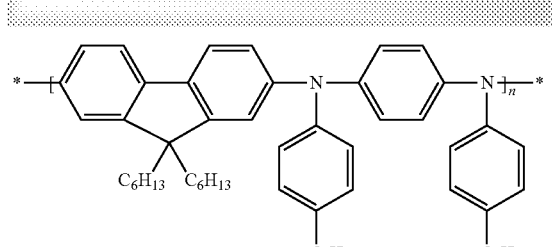
ADS250BE
-continued
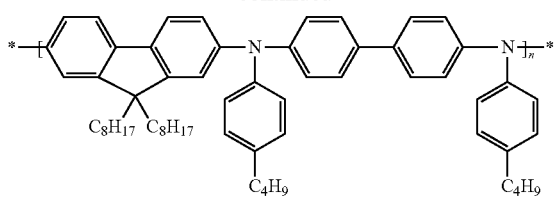
ADS251BE
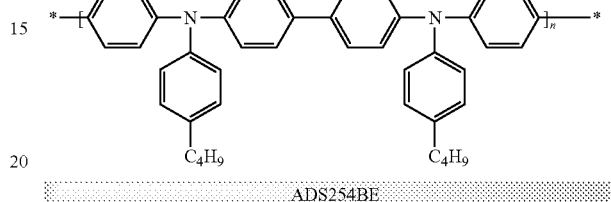
ADS254BE
(Currently available from American dye Source, Inc. Other examples include:
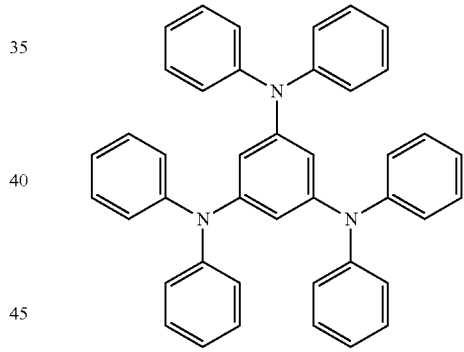
1,3,5-Tris(diphenylamino)benzene
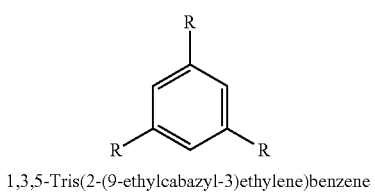
1,3,5-Tris(2-(9-ethylcabazyl-3)ethylene)benzene
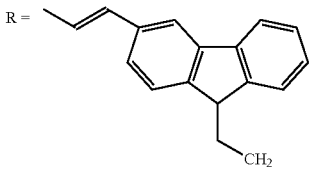

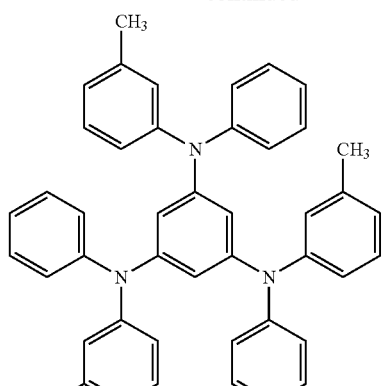
1,3,5-Tris[(3-methylphenyl)phenylamino]benzene

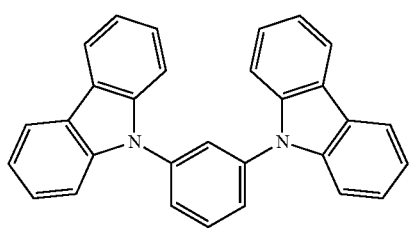
1,3-Bis(N-carbazolyl)benzene

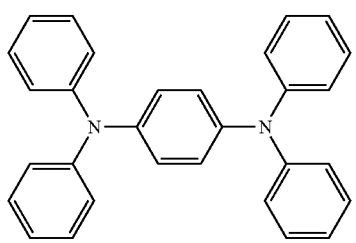
1,4-Bis(diphenylamino)benzene

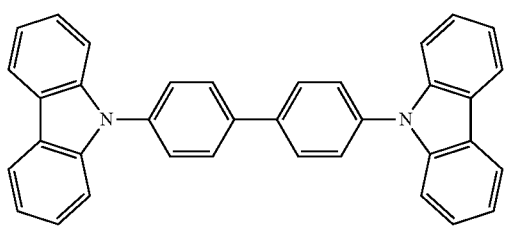
4,4'-Bis(N-carbazolyl)-1,1'-biphenyl

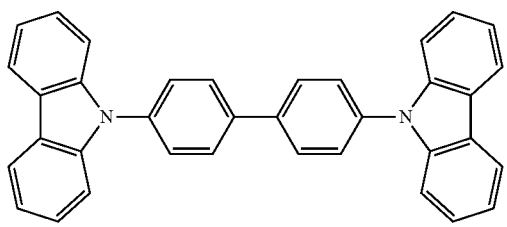
4,4'-Bis(N-carbazolyl)-1,1'-biphenyl

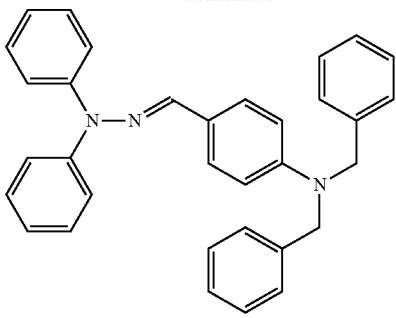
4-(Dibenzylamino)benzaldehyde-N,N-diphenylhydrazone

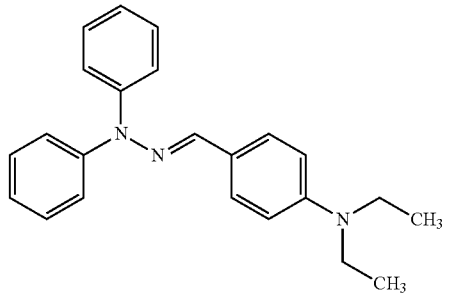
4-(Diethylamino)benzaldehyde diphenylhydrazone

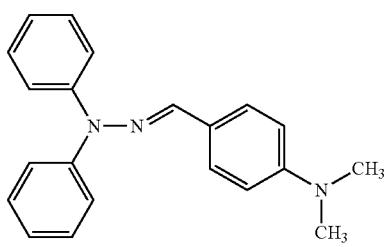
4-(Dimethylamino)benzaldehyde diphenylhydrazone

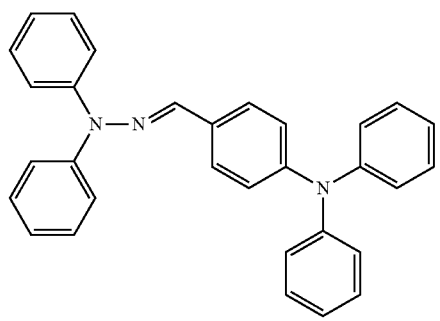
4-(Diphenylamino)benzaldehyde diphenylhydrazone

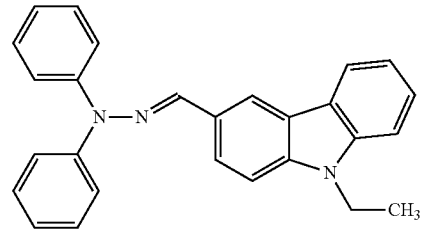
9-Ethyl-3-carbazolecarboxaldehyde diphenylhydrazone

-continued

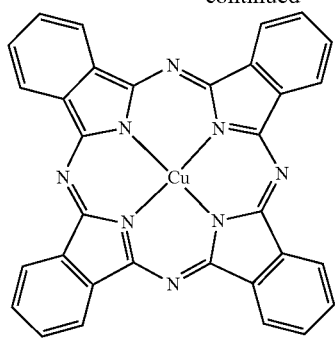
Copper(II) phthalocyanine

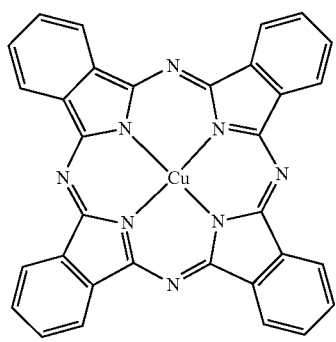
Copper(II) phthalocyanine

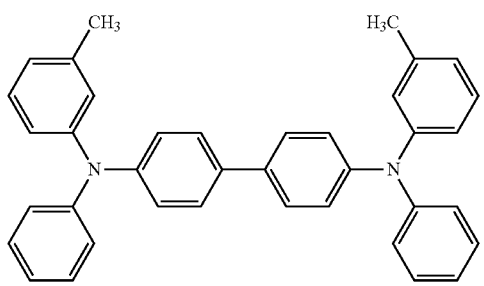
N,N'-Bis(3-methylphenyl)-N,N'-diphenylbenzidine

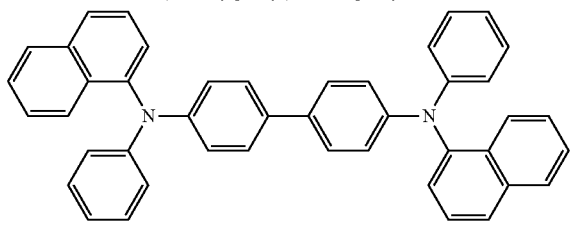
N,N'-Di-[(1-naphthyl)-N,N'-diphenyl]-1,1'-biphenyl)-4,4'-diamine

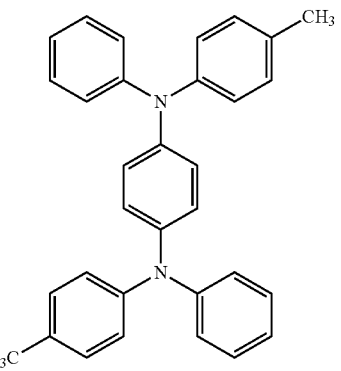
N,N'-Diphenyl-N,N'-di-p-tolylbenzene-1,4-diamine

-continued

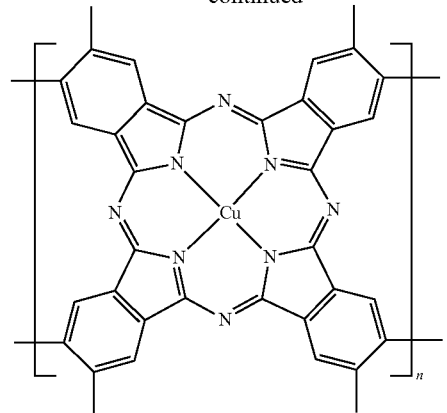
Poly(copper phthalocyanine)

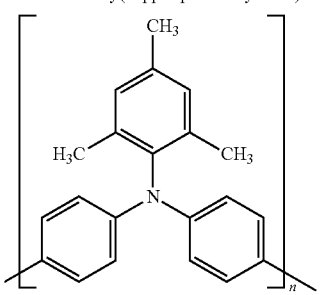
Poly[bis(4-phenyl)(2,4,6-trimethylphenyl)amine]

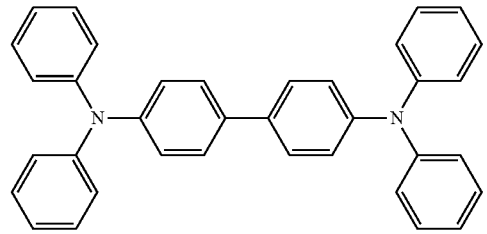
Tetra-N-phenylbenzidine

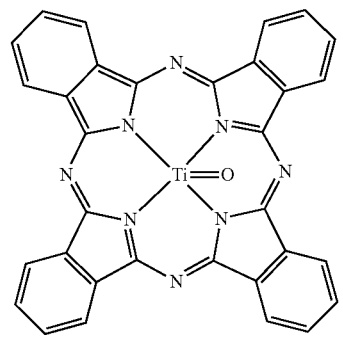
Titanyl phthalocyanine Dye content

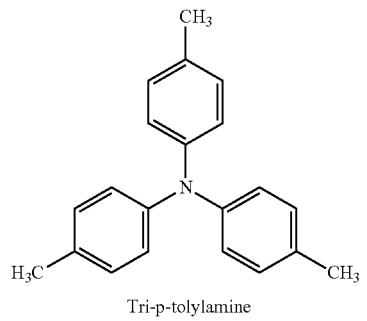
Tri-p-tolylamine

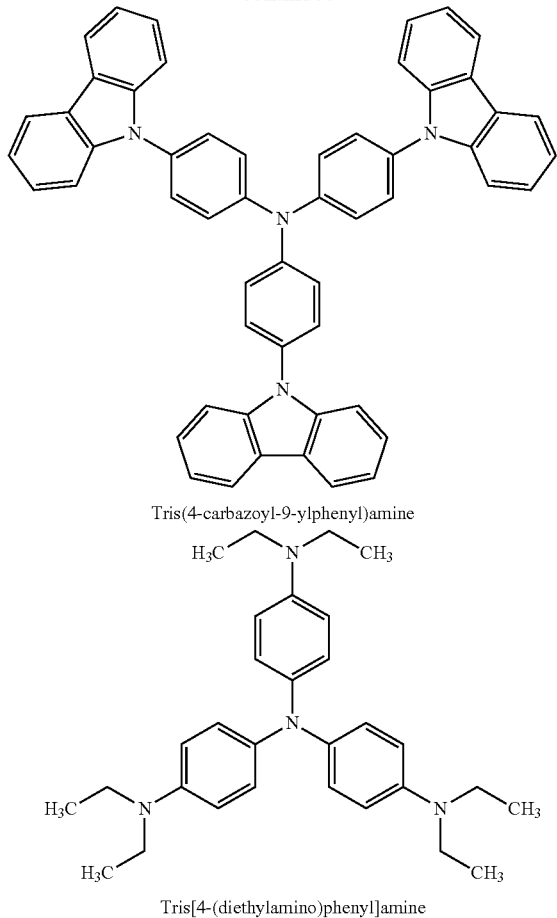

Tris(4-carbazoyl-9-ylphenyl)amine

Tris[4-(diethylamino)phenyl]amine (Commercially available from Sigma-Aldrich).

Hole transport materials are also described in, for example, US Patent Publications 2010/0292399 published Nov. 18, 2010; 2010/010900 published May 6, 2010; and 2010/0108954 published May 6, 2010.

One example of a hole transporting material is poly(9,9-dioctylfluorene-co-N-(4-butylphenyl)diphenylamine) (TFB).

Conjugated Polymer

One particular example of hole transporting material is a conjugated polymer, and the composition can comprise at least one conjugated polymer. Conjugated polymers are known in the art including their use in organic electronic devices. See for example Friend, "Polymer LEDs," *Physics World*, November 1992, 5, 11, 42-46; see for example Kraft et al., "Electroluminescent Conjugated Polymers-Seeing Polymers in a New Light," *Angew. Chem. Int.* Ed. 1998, 37, 402-428. In addition, electrically conductive or conjugated polymers are described in *The Encyclopedia of Polymer Science and Engineering*, Wiley, 1990, pages 298-300, including polyacetylene, poly(p-phenylene), poly(p-phenylene sulfide), polypyrrole, and polythiophene, including families of these polymers and derivatives in these polymer systems, which is hereby incorporated by reference in its entirety. This reference also describes blending and copolymerization of polymers, including block copolymer formation.

The conjugated polymer can be any conjugated polymer, including polythiophenes, and can be homopolymers, copolymers, or block copolymers. Synthetic methods, doping, and polymer characterization, including regioregular polythiophenes with side groups, is provided in, for example, U.S. Pat. No. 6,602,974 to McCullough et al. and U.S. Pat. No. 6,166,172 to McCullough et al., which are hereby incorporated by reference in their entirety. Additional description can be found in the article, "The Chemistry of Conducting Polythiophenes," by Richard D. McCullough, *Adv. Mater.* 1998, 10, No. 2, pages 93-116, and references cited therein, which is hereby incorporated by reference in its entirety. Another reference which one skilled in the art can use is the *Handbook of Conducting Polymers*, $2^{nd}$ Ed. 1998, Chapter 9, by McCullough et al., "Regioregular, Head-to-Tail Coupled Poly(3-alkylthiophene) and its Derivatives," pages 225-258, which is hereby incorporated by reference in its entirety. This reference also describes, in chapter 29, "Electroluminescence in Conjugated Polymers" at pages 823-846, which is hereby incorporated by reference in its entirety.

Polythiophenes are further described, for example, in Roncali, J., *Chem. Rev.* 1992, 92, 711; Schopf et al., *Polythiophenes: Electrically Conductive Polymers*, Springer: Berlin, 1997. See also for example U.S. Pat. Nos. 4,737,557 and 4,909,959.

Polymeric semiconductors are described in, for example, "Organic Transistor Semiconductors" by Katz et al., *Accounts of Chemical Research*, vol. 34, no. 5, 2001, page 359 including pages 365-367, which is hereby incorporated by reference in its entirety.

Conjugated polymers can be, for example, copolymers including block copolymers. Block copolymers are described in, for example, *Block Copolymers, Overview and Critical Survey*, by Noshay and McGrath, Academic Press, 1977. For example, this text describes A-B diblock copolymers (chapter 5), A-B-A triblock copolymers (chapter 6), and $-(AB)_n$-multi-block copolymers (chapter 7), which can form the basis of block copolymer types in the present invention.

Additional block copolymers, including polythiophenes, are described in, for example, Francois et al., *Synth. Met.* 1995, 69, 463-466, which is incorporated by reference in its entirety; Yang et al., *Macromolecules* 1993, 26, 1188-1190; Widawski et al., *Nature (London)*, vol. 369, Jun. 2, 1994, 387-389; Jenekhe et al., *Science*, 279, Mar. 20, 1998, 1903-1907; Wang et al., *J. Am. Chem. Soc.* 2000, 122, 6855-6861; Li et al., *Macromolecules* 1999, 32, 3034-3044; Hempenius et al., *J. Am. Chem. Soc.* 1998, 120, 2798-2804.

Substituents which can be used to solubilize conducting polymers with side chains include alkoxy and alkyl including for example C1 to C25 groups, as well as heteroatom systems which include for example oxygen and nitrogen. In particular, substituents having at least three carbon atoms, or it least five carbon atoms can be used. Mixed substituents can be used. The substituents can be nonpolar, polar or functional organic substitutents. The side group can be called a substituent R which can be for example alkyl, perhaloalkyl, vinyl, acetylenic, alkoxy, aryloxy, vinyloxy, thioalkyl, thioaryl, ketyl, thioketyl, and optionally can be substituted with atoms other than hydrogen.

Conjugated polymers can comprise heterocyclic monomer repeat units, and heterocyclic polymers are particularly preferred. A particularly preferred system is the polythiophene system, regioregular polythiophene system, the 3-substituted polythiophene system, and the 3,4-disubstituted polythiophene system. In some embodiments, the conjugated polymer comprises at least one polythiophene comprising an alkoxy substituent at either the 3-position or the 4 position or both. Polymers can be obtained from Plextronics, Inc., Pittsburgh, Pa. including for example polythiophene-based polymers such as for example PLEXCORE, Plexcoat, and similar materials.

3-Substituted Polythiophene

One important example of a conjugated polymer, and formulations and devices using the polymer, is a 3-substituted polythiophene. Preferable, the 3-substituted polythiophene may be a poly(3-alkoxythiophene). In a poly(3-alkoxythiophene), as used herein, the alkoxy side group is bonded to the thiophene via the oxygen atom and additional atoms can be present in the substituent such that the alkoxy group can be, for example, a polyether. For example, as used herein, an alkoxy group can be, for example, a methoxyethoxyethoxy group.

The conjugated polymer can be a regiorandom or a regioregular material. The degree of regioregularity can be, for example, about 0 to 100%, or about 25 to 99.9%, or about 50 to 98%.

In particular, another important example of a conjugated polymer, and formulations and devices using the polymer, is a regioregular polythiophene. Preferably, regioregularity of the polythiophene may be, for example, at least about 85%, or at least about 95%, or at least about 98%. In some embodiments, the degree of regioregularity can be at least about 70%, or at least about 80%. In yet other embodiments, the regioregular polythiophene has a degree of regioregularity of at least about 90%, or a degree of regioregularity of at least about 98%.

One example of a poly(3-alkoxythiophene) can be represented by:

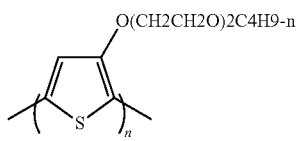

3,4-Disubstituted Polythiophene

One important example of a conjugated polymer, and formulations and devices using the polymer, is a 3,4-disubstituted polythiophene. Preferably, the 3,4-disubstituted polythiophene may be a poly(3,4-dialkoxythiophene) wherein as described above the alkoxy side group can comprise a plurality of heteroatoms, and the poly(3,4-dialkoxythiophene) can be, for example, a poly(3,4-di-polyether)-thiophene. A polyether is a molecule with more than one ether group. The alkoxy and polyether side groups can donate electrons to the polymer backbone chain.

The 3,4-disubstituted polythiophene may have a symmetrical monomer repeating unit. Often times, the 3,4-disubstituted polythiophene comprises a 3,4-substituted thiophene as the repeating unit, with an oxygen atom directly attached to the 3- and 4-positions of the disubstituted thiophene and polymerized through the 2- and 5-positions. Substituents can be used to solubilize the 3,4-substituted thiophene with side chains that can include alkoxy and polyether, including for example, straight or branched carbon chains, for example, C1 to C25 groups, wherein one, two, three, four, five, or six of the carbon atoms in the chains may be replaced by heteroatoms, such as, oxygen and/or nitrogen.

The conjugated polymer may be prepared by polymerization of a monomer unit, such as 2,5-dibromo-3,4-bis(2-(2-butoxyethoxy)ethoxy)thiophene, or 2,5-dibromo-3,4-bis(2-(2-ethoxyethoxy)ethoxy)thiophene; 2,5-dibromo-3,4-bis(2-(2-methoxyethoxy)ethoxy)thiophene; 2,5-dibromo-3,4-bis(2-(2-butoxyethoxy)ethoxy)thiophene; 2,5-dibromo-3,4-bis(2-(2-butoxybutoxy)butoxy)thiophene; and 2,5-dibromo-3,4-bis(2-(2-methoxymethoxy)methoxy)thiophene.

Any known methods of polymerization may be used to obtain the 3,4-disubstituted polythiophene. Typically, the polymer itself can be obtained by GRIM polymerization of the 2,5-dibromo derivative of the dialkoxythiophene or dipolyetherthiophene using a Nickel catalyst.

GRIM polymerization of a symmetrical monomer is described in, for example, Campos et al., *Photovoltaic Activity of a PolyProDOT Derivative in a Bulk Heterojunction Solar Cell*, Solar Energy Materials & Solar Cells, August 2006.

The conjugated polymer can be a 3,4-disubstituted polythiophene, such as poly(3,4-bis(2-(2-butoxyethoxy)ethoxy)thiophene)-2,5-diyl, poly(3,4-bis(2-(2-ethoxyethoxy)ethoxy)thiophene)-2,5-diyl; poly(3,4-bis(2-(2-methoxyethoxy)ethoxy)thiophene)-2,5-diyl; poly(3,4-bis(2-(2-butoxyethoxy)ethoxy)thiophene)-2,5-diyl; poly(3,4-bis(2-(2-butoxybutoxy)butoxy)thiophene)-2,5-diyl; and poly(3,4-bis(2-(2-methoxymethoxy)methoxy)thiophene)-2,5-diyl.

Typically, the conjugated polymer can be a 3,4-disubstituted polythiophene represented by:

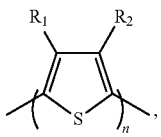

wherein independently $R_1$ can be an optionally substituted alkoxy group or an alkoxy heteroatom group, such as, for example, an alkoxyalkoxyalkoxy moiety, and independently $R_2$ can be an optionally substituted alkoxy group alkoxy heteroatom group, such as, for example, an alkoxyalkoxyalkoxy moiety; or wherein independently $R_1$ can be optionally substituted alkyl, and optionally substituted aryloxy, and independently $R_2$ can be optionally substituted alkyl, and optionally substituted aryloxy. Examples of substituents for the optional substitution include hydroxyl, phenyl, and additional optionally substituted alkoxy groups. The alkoxy groups can be in turn optionally substituted with hydroxyl, phenyl, or alkoxy groups; or wherein independently $R_1$ can be an optionally substituted alkylene oxide, and independently $R_2$ can be an optionally substituted alkylene oxide. Substituents can be for example hydroxyl, phenyl, or alkoxy groups; or wherein independently $R_1$ can be optionally substituted ethylene oxide or optionally substituted propylene oxide or other lower alkyleneoxy units, and independently $R_2$ can be optionally substituted ethylene oxide or optionally substituted propylene oxide or other lower alkyleneoxy units. Substituents can be for example hydroxyl, phenyl, or alkoxy groups; or wherein independently $R_1$ can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy, and independently $R_2$ can be an optionally substituted alkylene such as for example methylene or ethylene, with substituents being for example optionally substituted alkyleneoxy such as ethyleneoxy or propyleneoxy; substituents can be for example hydroxyl, phenyl, or alkoxy.

In addition, the substituent groups $R_1$ and $R_2$ can be linked to the thiophene by an oxygen atom such as alkoxy or phenoxy, wherein the substituent can be characterized by the corresponding alcohol or phenol, respectively. The alcohol, for example, can be linear or brandied, and can have C2-C20, or C4-C18, or C6 to C14 carbon atoms. The alcohol can be for example an alkyl alcohol, or an ethylene glycol, or a propylene glycol, or a dicthylene glycol, or a dipropylene glycol, or a tripropylene glycol. Additional examples can be monoethylene glycol ethers and acetates, diethylene glycol ethers and acetates, triethylene glycol ethers and acetates, and the like. Examples of alcohols which can be linked to the thiophene ring through the oxygen atom include hexyl cellosolve, Dowanol PnB, ethyl carbitol, Dowanol DPnB, phenyl carbitol, butyl cellosolve, butyl carbitol, Dowanol DPM, diisobutyl carbinol, 2-ethylhexyl alcohol, methyl isobutyl carbinol, Dowanol Eph, Dowanol PnP, Dowanol PPh, propyl carbitol, hexyl carbitol, 2-ethylhexyl carbitol, Dowanol DPnP, Dowanol TPM, methyl carbitol, Dowanol TPnB. The trade names are well known in this art. Polythiophene substituents, including various alkoxy and polyether substituents, and formulations are described in for example U.S. patent application Ser. No. 11/826,394 filed Jul. 13, 2007 (US publication 2008/0248313).

The degree of polymerization, 'n' is not particularly limited but can be for example 2 to 500,000 or 5 to 100,000 or 10 to 10,000, or 10 to 1,000, 10 to 500, or 10 to 100. In many cases, and polymer has a number average molecular weight between approximately 5,000 and 100,000 g/mol. In some embodiments, R can be a monoalkoxy, dialkoxy, trialkoxy, or tetraalkoxy group and the conjugated polymer is a poly(3,4-dialkoxythiophene) or poly(3,4-dipolyetherthiophene).

An example of side groups is the butoxyethoxy(ethoxy) group and the polymer can be poly(3,4-bis(2-(2-butoxyethoxy)ethoxy)thiophene-2,5-diyl).

Optional Matrix Material

In at least one embodiment, a matrix material may be incorporated into a composition for forming a transparent hole injection layer (HIL) or hole transport layer (HTL). Transmission of light is important, and good transmission at higher film thicknesses is particularly important. For example, an HIL or HTL can be prepared that can transmit about 85% to about 90% or greater (i.e., % T>85-90%) of light having a wavelength of about 400-800 nm.

In one embodiment, the HIL layer has a thickness of, for example, about 5 nm to about 500 nm, or about 5 nm to about 150 nm, or about 20 nm to about 100 nm, or about 20 nm to about 60 nm. Another range for thickness is, for example, about 60 nm to about 200 nm.

Thus, an additional advantage of the present embodiments can be the formation of substantially transparent HILs or HTLs having moderately high thicknesses. Thick HILs or HTLs can also be used to eliminate shorts in semiconductor devices without adversely impacting operating voltage.

In some embodiments, the composition comprises at least one matrix material. The matrix material can be a lower or higher molecular weight material. The matrix material can be, for example, a synthetic polymer that is different from the conjugated polymer. See, for example, US Patent Publication No. 2006/0175582 published Aug. 10, 2006. The synthetic polymer can comprise, for example, a carbon backbone. In some embodiments, the synthetic polymer has at least one polymer side group comprising an oxygen atom or a nitrogen atom. The synthetic polymer may be a Lewis base. Typically, the synthetic polymer comprises a carbon backbone and has a glass transition temperature of greater than 25° C. The synthetic polymer may also be a semi-crystalline or crystalline polymer that has a glass transition temperature equal to or lower than 25° C. and a melting point greater than 25° C. The synthetic polymer may comprise acidic groups. Additionally, the conjugated polymer may comprise acidic groups. In some embodiments, both the conjugated polymer and the second polymer comprise acidic groups.

The matrix material, which can be the second polymer can be a planarizing agent. A matrix material or a planarizing agent may be comprised of, for example, a polymer or oligomer such as an organic polymer such as poly(styrene) or poly(styrene) derivatives, poly(vinyl acetate) or derivatives thereof, poly(ethylene glycol) or derivatives thereof, poly(ethylene-co-vinyl acetate), poly(pyrrolidone) or derivatives thereof (e.g., poly(1-vinylpyrrolidone-co-vinyl acetate)), poly(vinyl pyridine) or derivatives thereof, poly(methyl methacrylate) or derivatives thereof, poly(butyl acrylate), poly(aryl ether ketones), poly(aryl sulfones), poly(aryl ether sulfones), poly(esters) or derivatives thereof, or combinations thereof More generally, a matrix material or a planarizing agent can be comprised of polymers or oligomers built from monomers such as $CH_2CH\,Ar$, where Ar– any aryl or functionalized aryl group, isocyanates, ethylene oxides, conjugated dienes, $CH_2CHR_1R$ (where $R_1$=alkyl, aryl, or alkyl/aryl functionalities and R=H, alkyl, Cl, Br, F, OH, ester, acid, or ether), lactam, lactone, siloxanes, and ATRP macroinitiators. A planarizing agent can also be a polymer comprising optionally substituted fused aromatic rings or optionally substituted polycyclic aromatic hydrocarbon side groups. Additionally, the hole-transporting compounds described below can also be planarizing agents.

In other embodiments, the matrix material or a planarizing agent may be comprised of, for example, at least one semiconducting matrix component. The semiconducting matrix component is different from the conjugated polymer described above. The semiconducting matrix component can be a semiconducting small molecule, such as a hole transporting compound, or a semiconducting polymer that is typically comprised of repeat units comprising hole transporting units in the main-chain and/or in a side-chain. The semiconducting matrix component may be in the neutral form or may be doped, and is typically soluble in organic solvents, such as toluene, chloroform, Tiff, acetonitrile, cyclohexanone, anisole, chlorobenzene, o-dichlorobenzene, ethyl benzoate and mixtures thereof.

Examples of semiconducting small molecules, hole transport materials, and polymers suitable for use as matrix components are described by Marks et al., in U.S. Patent Application Pub. No. 2005/0147846 A1, entitled "Hole Transport Layer Compositions and Related Diode Devices;" and by Mathai et al., in U.S. patent application Ser. No. 12/605,768 tiled on Oct. 26, 2009, which are hereby incorporated by reference in their entireties.

Dopant

Dopants are known in the art and can react with conjugated polymers in doping reactions. The dopant can be an ionic compound. The dopant can comprise a cation and an anion.

The cation of the ionic compound can be, for example, V, Cr, Mn, Fe, Co, Ni, Cu, Nb, Mo, Tc, Ru, Rh, Pd, Ag, Ta, W, Re, Os, Ir, Pt, or Au.

The cation of the ionic compound can be, for example, gold, molybdenum, rhenium, iron, and silver cation.

The anion of the ionic compound can be, for example, a whole aromatic or heteroaromatic anion including, for example, an optionally substituted tetraarylborate, or a halogenatedtetraarylborate, or tetrakispentafluorophenylborate (TPFB).

Examples of an anion include structures represented by:
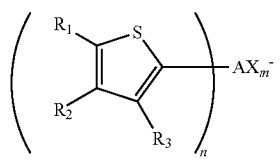
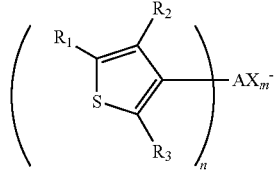
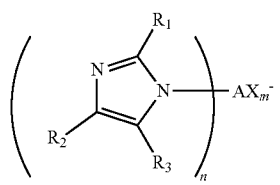
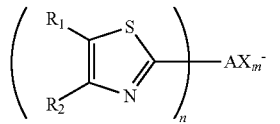
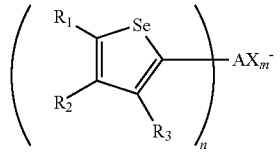
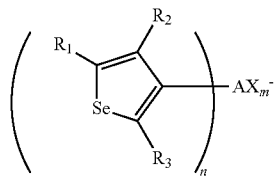
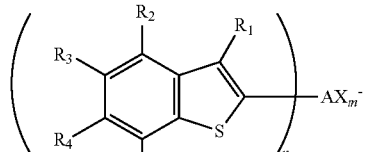
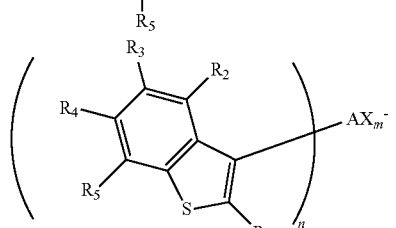
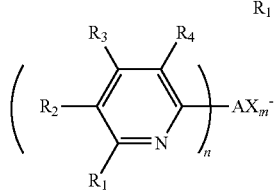
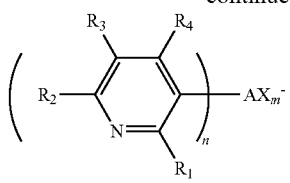
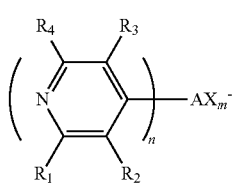
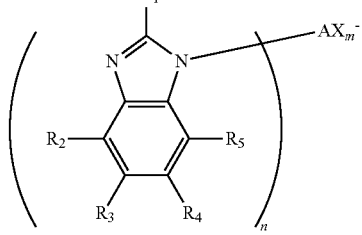
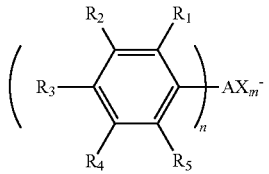
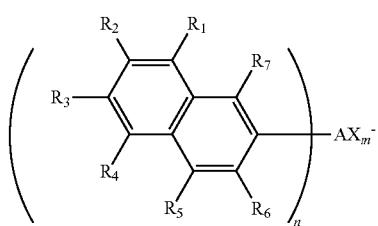
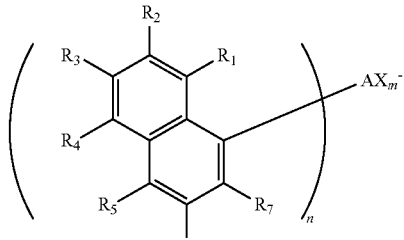
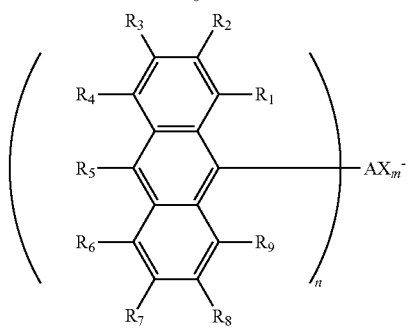

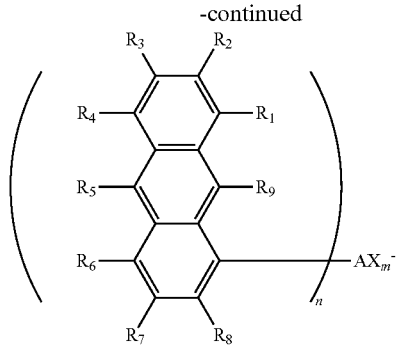

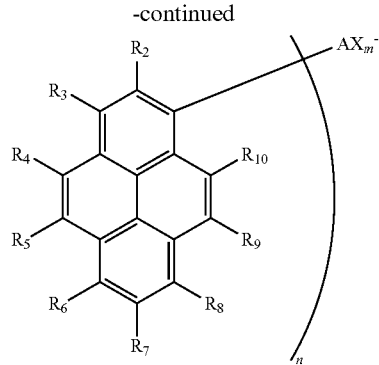

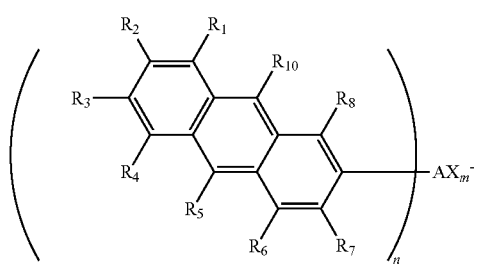

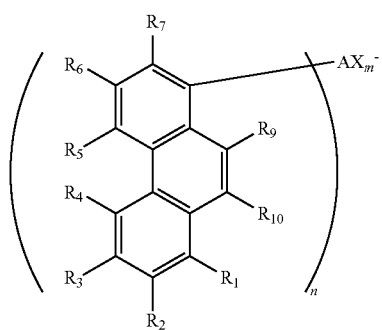

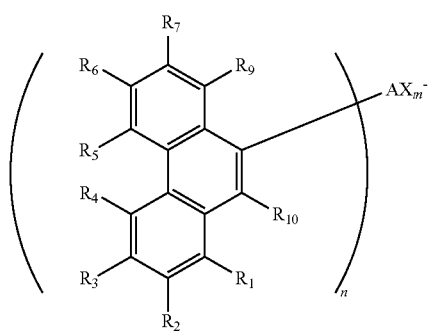

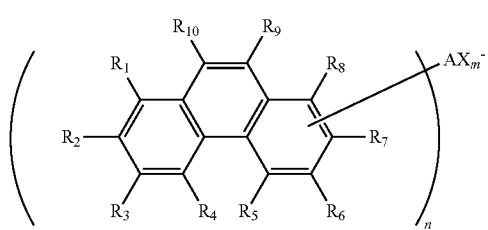

wherein independently, each of $R_1$ to $R_{10}$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, antimony, $SO_3$ or $CO_2$; X is F, Cl, Br, I or CN; n is 0 to 6; and m is ≤6-n. In one embodiment, n can be 1 to 6.

In other embodiments, the anion can be at least one of the structures represented by:

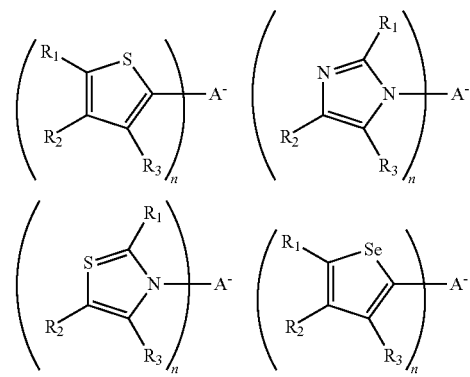

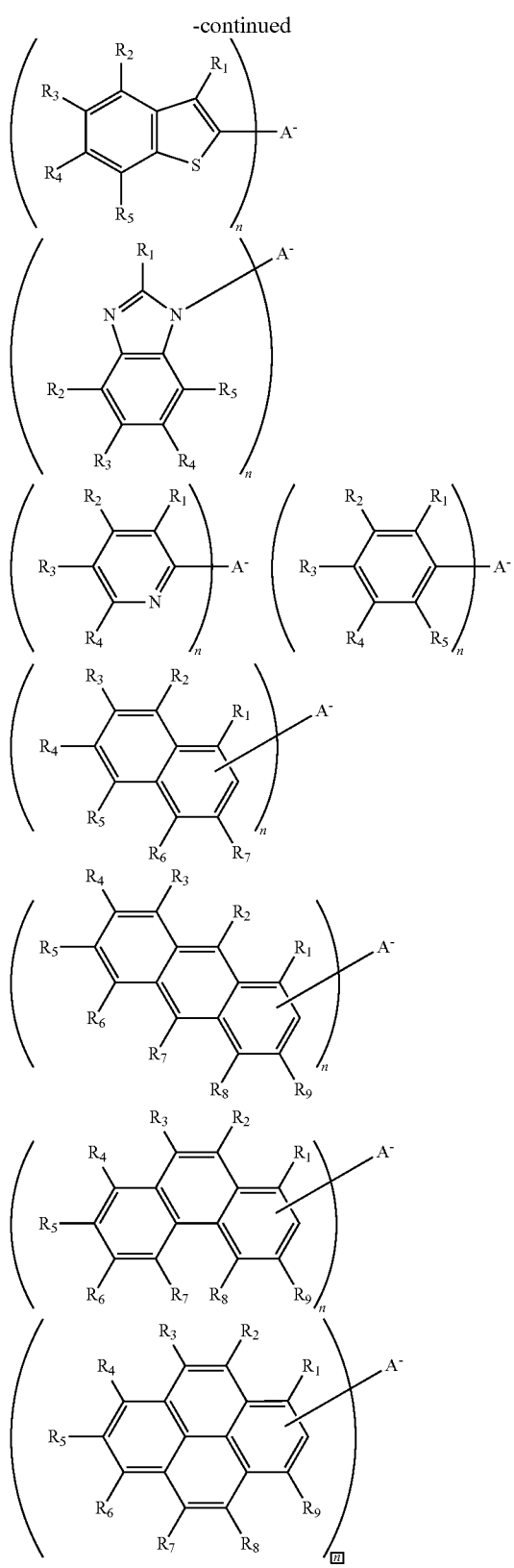

wherein independently, $R_1$ to $R_9$ can be, for example, H, an alkyl, a perfluoroalkyl (C1-C10), a polyether, F, Cl, Br, I, CN, an optionally substituted phenyl, or an optionally substituted naphthyl; "A" can be boron, gallium, phosphorous, or anti- mony; and n can be n=1 to 6. For example: if A is boron or gallium, then n is 4; if A is phosphorous or antimony, then n is 6.

In additional embodiments, the dopant can be a sulfonate or a carboxylate including alkyl, aryl, and heteroaryl sulfonates and carboxylates. For example, the A in the above twelve structures can be, in addition, to boron, gallium, phosphorous, or antimony, a sulfonate or carboxylate group. For the sulfonate and carboxylate embodiments of these twelve structures, the value of n can be 1.

Examples of sulfonate and carboxylate dopants include benzoate compounds, bis(trifluoromethanesulfonyl)imide, heptafluorobutyrate, hexafluoroantimonate, hexafluoroarsenate, hexafluorophosphate, tetrafluoroborate, methanesulfonate, trifluoromethanesulfonate, p-toluenesulfonate, pentafluoropropionate, tetrafluoroborate, and/or trifluoroborates. Examples include (2-nitrophenyl)trifluoroborate, benzofurazan-5-trifluoroborate, pyrimidine-5-trifluoroborate, pyridine-3-trifluoroborate, and 2,5-dimethylthiophene-3-trifluoroborate.

In other embodiments, the anion may comprise more than one aryl group. For example, an anion comprising more than one aryl group can be represented by:

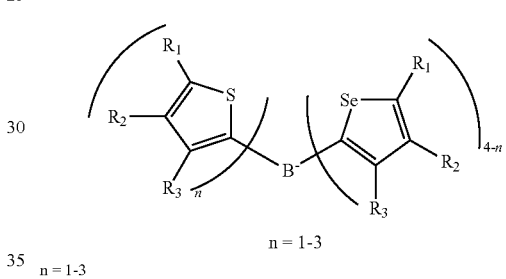

n = 1-3 wherein independently, $R_1$ to R3 can be H, an alkyl, a perfluoroalkyl (C1-C10), a polyether, F, Cl, Br, I, CN, an optionally substituted phenyl, or an optionally substituted naphthyl; and n can be n=1 to 3.

In one preferred embodiment, the dopant comprises silver tetrakis(pentafluorophenyl)-borate, and is represented by:

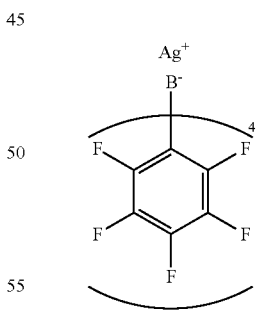

The conjugated polymer can be mixed with the dopant. A reaction can occur upon mixing as known in the art. In particular, the conjugated polymer can be doped with a dopant. A dopant can be, for example, a material that will undergo one or more electron transfer reaction(s) with, for example, a conjugated polymer, thereby yielding a doped conjugated polymer. The dopant can be selected to provide a suitable charge balancing counter-anion. For example, the dopant may undergo spontaneous electron transfer from the polymer to a cation-anion dopant such as a metal salt, leaving behind a conjugated polymer in its oxidized form with an associated anion and free metal. See, for example, Lebedev et al., Chem. Mater., 1998, 10, 156-163. As discussed herein, the conjugated polymer and the dopant, can refer to components that will react to form a doped polymer. The doping reaction can be a charge transfer reaction, wherein charge carriers are generated, and the reaction can be reversible or irreversible. Dopants are known in the art. See, for example, U.S. Pat. No. or Publication No. 7,070,867; 2005/0123793; and 2004/0113127.

The anion TPFB is known in the art. See, for example, Hijazi et al., *European J. Inorganic Chemistry*, 2008, 18, 2892-2898; Ogawa et al., *Organometallics*, 2005, 24(20), 4842-4844; Kuprat et al., *Organometallics*, 2010, 29(6), 1421-1427 (suggesting AgTPFB is less stable than LiTPFB). TPFB can complex with a variety of cations, including monovalent and divalent cations, and can also be coordinated or complexed with polar and nonpolar ligands such as acetonitrile, methylene chloride, diethyl ether, pentane, benzene, or toluene.

In one embodiment the dopant may be a silver salt, such as silver tetrakis(pentafluorophenyl)borate. Silver ions may undergo electron transfer to or from silver metal and the conducting polymer. See, for example, Lebedev et al., Chem. Mater., 1998, 10, 156-163.

In the final formulation, the composition can be distinctly different from the combination of original components (i.e., conjugated polymer and/or dopant may or may not be present in the final composition in the same form before mixing).

Some embodiments allow for removal of reaction byproducts from the doping process. For example, the metals such as silver can be removed by filtrations.

Cations such as iodonium salts and other dopant cations described in EP 1725079 and/or US 2007/0207341 can be excluded from the compositions. Anions can be excluded such as, for example, anions which are not wholly aromatic anions such as, for example, $[BF_4]$, $[PF_6]$, and bis(trifluoromethanesulfonimide).

An additional embodiment for dopant comprises the compounds and salts, including anions, found in U.S. Pat. No. 7,785,740 ("Overcharge Protection for Electrochemical Salts"), which is incorporated by reference herein in its entirety. $M_aQ$ overcharge protection salts are described comprising (as Q) borate and heteroborate clusters, wherein M are cations and a can be an integer like 1 or 2. In additional embodiments, anions of salts can be represented as $(B_{10}F_xZ_{10-x})^{2-}$ and $(B_{12}F_xZ_{12-x})^{2-}$ wherein Z can represent H, Cl, Br, or OR, where R can be, for example, H, $C_{1-8}$ alkyl or fluoroalkyl, or $C_{1-3}$ alkyl or fluoroalkyl. The value for x can be, for example, 4-12, or 7-12, or 7-11. Mixtures of salts can be used.

Thermal Stability

Thermal stability of the film layer and devices comprising the film layers is important. Some dopants such as silver salt dopants, for example, silver tetrakis(pentafluorophenyl)borate (AgTPFB), can provide increased thermal stability. Lithium salts are not desired because lithium provides decreased or no doping of conjugated polymers. The reduction potential of a lithium salt is much lower than that of a silver salt. Thus, in the present embodiments, a silver salt is preferred, for example AgTPFB.

The stability of a silver salt may depend on processing methods. For example, AgTPFB is preferably prepared by a metathesis of lithium tetrakis(pentafluorophenyl)-borate (LiTPFB) and silver nitrate by dissolving in acetonitrile followed by precipitation in water. Without being limited to a particular theory, in such a metathesis reaction, the acetonitrile may complex to the silver thereby improving its photolytic stability.

In one aspect, stability may be considered as photolytic stability or stability against discoloration. The stable AgTPFB prepared by a metathesis of the LiTPFB and dissolving in acetonitrile may be obtained as a white powder that does not change color in ambient conditions. On the other hand, unstable AgTPFB prepared without acetonitrile begins browning within 24 hours and continues to do so.

In another aspect, stability may be considered as thermal stability and can be measured by thermogravimetric analysis. Six exemplary samples (numbered EX 1 through EX 6) of a stable AgTPFB were prepared by a metathesis of the LiTPFB and dissolving in acetonitrile, followed by precipitation in water as described above. A comparative example (numbered CE-1) of LiTPFB was also prepared. As shown in FIG. 1, samples EX 1 to EX 6 shows better thermal stability across a wider temperature range. For example, EX 1 to EX 6 experience a change in weight of less than about 5% across a temperature range of 0 to 150 T. On the other hand, sample CE-1 is less thermally stable as it exhibits thermal instability character at a lower temperature, for example at about 25° C.

Accordingly, for silver salt dopants of the embodiments, the amount of lithium can be reduced to levels below detection limits.

Solvent System

The solvent system can be adapted for use and processing with other layers in the device such as the anode or light emitting layer. Aqueous and non-aqueous solvent systems can be used.

Different solvents can be used in the current solvent system. Typically, the solvents used are organic non-polar solvents. More typically, the solvents used are aprotic non-polar solvents. Use of aprotic non-polar solvents can provide, in at least some examples, the additional benefit of increased lifetimes of devices with emitter technologies which are sensitive to protons. Examples of such devices include PHOLEDs.

Common solvents used in the present solvent system include, for example, aromatic. Solvents such as tetrahydrofuran, chloroform, or aromatic hydrocarbons forms are used. Additional solvents include tetrahydropyran (THP), chloroform, alkylated benzenes, halogenated benzenes, NMP, DMF, DMAc, DMSO, methyl ethyl ketone, cyclohexanone, chloroform, dichloromethane, acetonitrile, acetone, THF, dioxane, dioxanes, ethyl acetate, ethyl benzoate, dimethyl carbonate, ethylene carbonate, propylene carbonate, 3-methoxypropionitrile, 3-ethoxypropionitrile or combinations thereof. The conjugated polymer is typically highly soluble and highly processable in these solvents.

For environmental compliance, one or more nonhalogenated solvents may be selected. Halogenated solvents can be substantially or totally excluded (e.g., used in less than 10%, or less than 5%, or less than 1%, or less than 0.1% by volume of total solvent carrier. In weighing such additional factors, it may be helpful to consult references such as, for example, Chereinisnoff, N. P, *Industrial Solvents Handbook*, $2^{nd}$ Ed. (Marcel Dekker, New York, 2003); Ash, M, *Handbook of Solvents*, $2^{nd}$ Ed. (Syapse Information Resources, 2003); Wypych, G., *Handbook of Solvents (Chemical)* (Noyes Publications, 2000); Hansen, C. M., Durkee, J. and Kontogeorgis, G, *Hanson Solubility Parameters: A User's Handbook* (Taylor and Francis, 2007); all of which are incorporated by reference in their entireties. For a more detailed discussion regarding selection of solvent systems comprising two or more solvents, see U.S. 61/090,464, filed Aug. 20, 2008, (043419-0256) which is incorporated by reference it its entirety.

Alternatively, it may be useful to select more than one solvent to use in the solvent system.

Other solvents might also be considered, that solubilize the conjugated polymer, that swell the conjugated polymer, or that even act as non-solvents for the polymer. The latter may be included in the solvent system in varying quantities to modify ink properties such as wetting, viscosity, morphology control.

Solvents to be considered may include ethers (optionally substituted with C1-C10 alkyl chains) such as anisole, ethoxybenzene, dimethoxy benzenes and glycol ethers, such as: ethylene glycol diethers such as 1,2-dimethoxy ethane, 1,2-diethoxy ethane, 1,2-dibutoxy ethane; diethylene glycol diethers such as diethylene glycol dimethyl ether, diethylene glycol diethyl ether; propylene glycol diethers such as propylene glycol dimethyl ether, propylene glycol diethyl ether, propylene glycol dibutyl ether; dipropylene glycol diethers such as dipropylene glycol dimethyl ether, dipropylene glycol diethyl ether, dipropylene glycol dibutyl ether; also, higher analogs (tri- and tetra-) of the ethylene glycol and propylene glycol ethers mentioned above.

Still other solvents can be considered, such as ethylene glycol monoether acetates and propylene glycol monoether acetates, wherein the ether can be selected, for example, from: methyl, ethyl, n-propyl, iso-propyl, n-butyl, sec-butyl, tert-butyl, cyclohexyl. Also, higher glycol ether analogs of above list such as di-, tri- and tetra-. Examples include, but are not limited to, propylene glycol methyl ether acetate, 2-ethoxyethyl acetate, 2-butoxyethyl acetate.

Yet other possible solvents include aliphatic and aromatic ketones such as acetonyl acetone, methyl isobutyl ketone, methyl isobutenyl ketone, 2-hexanone, 2-pentanone, acetophenone, ethyl phenyl ketone, cyclohexanone, cyclopentanone, methylethyl ketone. In some embodiments, these solvents are avoided. In some embodiments, ketones with protons on the carbon located alpha to the ketone are avoided such as cyclohexanone, methylethylketone, and acetone.

Additional possible solvents include N,N-dimethyl formamide, N,N-dimethyl acetamide, N-methyl pyrrolidone, dimethyl sulfoxide, tetramethylene sulfoxide, acetonitrile, benzonitrile, ethylene carbonate, propylene carbonate, and the like.

Other examples include cyclic ethers such as, for example, tetrahydropyran (THP). Solvent can be used such that polymerization of the solvent can be avoided. Another example is methoxypropionitrile.

A preferred group of solvents is toluene, xylene(s), tetralene, mesitylene, phenetole, 4-methylanisole, anisole, tetrahydropyran, 3-methoxypropionitrile, 3-ethoxypropionitrile, methyl benzoate ethyl benzoate, propyleneglycolmethyl ether acetate, 1,2-dimethoxyethane, and diethyleneglycoldiethylether, and combinations thereof. Other preferred solvent combinations are shown in the working examples section.

The one or more solvents can be used in varying proportions to improve the ink characteristics such as substrate wettability, ease of solvent removal, viscosity, surface tension, and jettability.

The composition comprising the conjugated polymer, dopant and solvent can be cast and annealed as a film on a substrate optionally containing an electrode or additional layers used to improve electronic properties of the final device. The Films may be intractable to an organic solvent, which can be the solvent in the ink for subsequently coated or deposited layers during fabrication of a device. The films may be intractable to toluene, which can be the solvent in the ink for subsequently coated or deposited layers during fabrication of a device.

In one embodiment, the HIL layer is thermally annealed. In one embodiment, the HIL layer is thermally annealed at temperature of about 25° C. to about 250° C. In one embodiment, the HIL layer is thermally annealed at temperature of about 25° C. to about 250° C. and at reduced pressures of $10^{-6}$ to 760 torr. In one embodiment, the HIL layer is thermally annealed at temperature of about 90° C. to about 170° C. for about 5 to about 15 minutes. In one embodiment, the HIL layer is heated to remove solvent.

Film formation can be carried out by methods known in the art including for example spin casting, dip casting, dip coating, slot-dye coating, ink jet printing, gravure coating, doctor blading, and any other methods known in the art for fabrication of, for example, organic electronic devices.

Amounts

In one embodiment, the composition comprises between about 40% and 75% by weight of the conjugated polymer and between about 25% and 55% by weight of the dopant. In another embodiment, the composition comprises between about 50% and 65% for the conjugated polymer and between about 35% and 50% of the dopant. Typically, the amount by weight of the conjugated polymer is greater than the amount by weight of the dopant. The conjugated polymer can be any conjugated polymer as described above. Typically, the repeat unit is 3-substituted polythiophene or a 3,4-disubstituted polythiophene. Typically, the dopant can be a silver salt, such as silver tetrakis(pentaflouorophenyl)borate in an amount of about 0.25 to 0.5 m/ru, wherein m is the molar amount of s salt and ru is the molar amount of conjugated polymer repeat unit.

In some embodiments, the composition comprises a solvent or a solvent carrier. Typically, in embodiments comprising a solvent or solvent carrier, the composition comprises at least 95 wt % solvent or solvent carrier, and the composition is characterized by a percent solids of 5 wt % or less.

In one embodiment, the amount of solids content is about 0.1 wt. % to 100 wt. %, wherein 100 wt. % represents a dry material such as a dry powder. In one embodiment, the solids content is about 0.3 wt. % to about 10 wt. %. In another embodiment, the solids content is about 0.5 wt. % to about 5 wt. %.

In one embodiment, a dry powder is prepared by removal of solvent. The result can be a dry or substantially dry material such as a powder. The amount of residual solvent can be, for example, 10 wt. % or less, or 5 wt. % or less, or 1 wt. % or less. The dry or substantially powder can be redispersed or redissolved in a new solvent system.

The amount of the optional matrix material can be controlled and measured as a weight percentage relative to the amount of the hole transport material and dopant combined For example, the amount can be 0 to 99.5 wt. %, or about 10 wt. to about 98 wt. %, or about 20 wt. % to about 95 wt. %. In the embodiment with 0 wt. %, the matrix material is not used.

Materials can be purified to remove, for example, halogens and metals. Halogens include, for example, bromine and iodine. Metals include, for example, the cation of the dopant, including the reduced form of the cation of the dopant, or metals left from catalyst or initiator residues. Metals include, for example, silver, nickel, and magnesium. The amounts can be less than, for example, 100 ppm, or less than 10 ppm, or less than 1 ppm.

Metal can be removed. In one embodiment, the amount of metal (for example, silver) content can be, for example, 0-10% in dry powder, and/or 0-0.5% in solution. In another embodiment, the amount of metal (for example, silver) content can be, for example, 0-1% in dry powder, and/or 0-0.05% in solution. In another embodiment, the amount of metal (for example, silver) content can be, for example, 0-0.5% in dry powder, and/or 0-50 ppm in solution Metal content, including silver content, can be measured by ICP-MS, particularly for concentrations greater than 50 ppm.

Unreacted dopant can be also present or removed, including unreacted cation, including unreacted silver ion.

Method of Making Steps

The devices described herein can be made by methods known in the art including, for example, solution processing. Inks can be applied and solvents removed by methods known in the art.

Purification methods can be carried out. For example, the dopant, such as a metal salt, in particular a silver salt, for example, silver tetrakis(pentafluorophenyl)borate, may undergo spontaneous electron transfer from the conjugated polymer to the metal salt leaving behind a conjugated polymer in its oxidized form, for example, as a p-type conjugated polymer, with an associated anion and free metal. The metal may be scavenged from the formulation, for example, by passing through a bed of celite or at least one glass fiber filter (stacked or unstacked; 0.5 micron). For example, about 50 mL of the dopant in solution may be passed through a celite bed (packed dry; 26 mm diameter, 15 mm thick) in a glass syringe. Slight pressure may be applied to increase the solution flow rate.

Also provided is an embodiment for a method of making a metal salt including, for example, a silver tetraarylborate salt such as AgTPFB. For example, a metathesis reaction can be carried out with a water soluble silver salt and a tetraarylborate salt. For example, the reaction can be represented by:

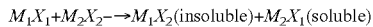

$$M_1X_1 + M_2X_2 \rightarrow M_1X_2 (\text{insoluble}) + M_2X_1 (\text{soluble})$$

The precipitation of $M_1X_2$ can facilitate, for at least some cases, driving the reaction to the right to produce relatively high yields. $M_1$ can be a metal such as, for example, silver, and $M_2$ can be a metal such as, for example, lithium. $X_1$ can provide water solubility such as, for example, nitrate. $X_2$ can be a non-coordinating anion such as tetraarylborate. $M_1X_2$ can be insoluble in water, and $M_2X_1$ can be soluble in water.

Figure 2:
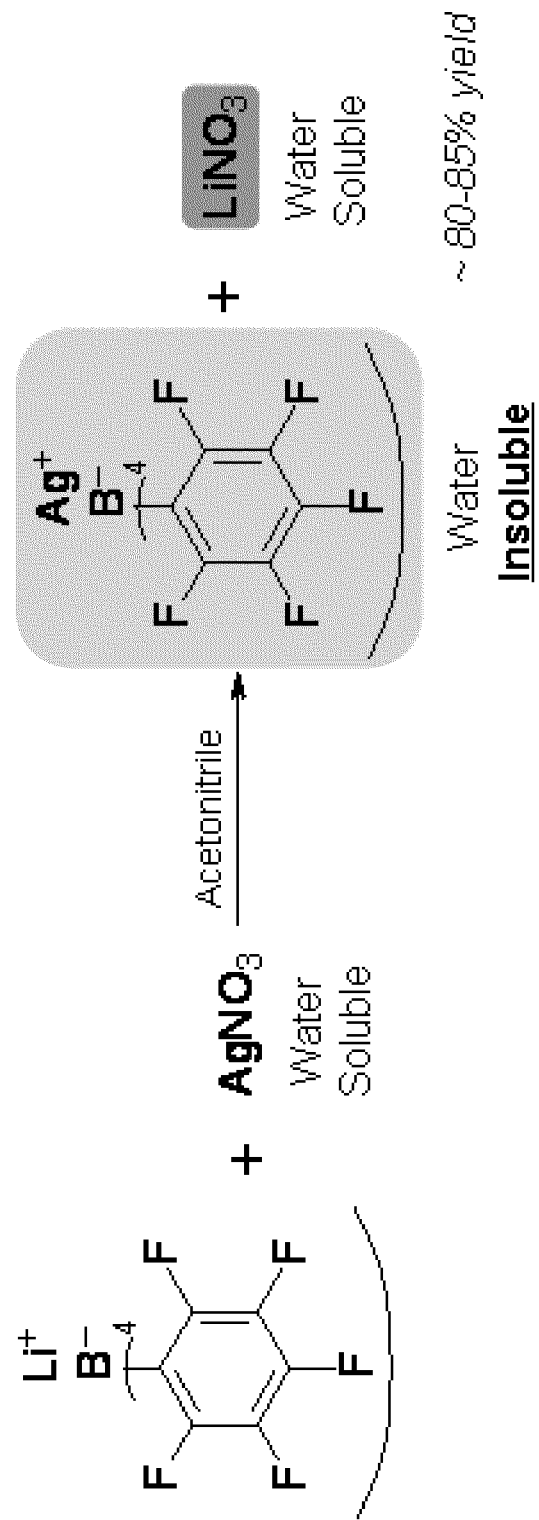
FIG. 2 illustrates a non-limiting metathesis reaction for forming Ag(TPFB)

For example, as shown in FIG. 2, AgTPFB can be preferably prepared by a metathesis of lithium tetrakis(pentafluorophenyl)-borate (LiTPFB) and silver nitrate by dissolving in acetonitrile followed by precipitation in water. For example, a solution of silver nitrate in acetonitrile (e.g., 3 wt. % to 25 wt. %, or 5 wt. % to 15 wt. %, or 10 wt. %) can be mixed with, for example, LiTPFB (e.g., 3 wt. % to 25 wt. %, or 5 wt. % to 15 wt. %, 10 wt. %) at a temperature of about 25° C. The reaction product which is desired can precipitate with the mixture of solutions and can be, in particular, precipitated into a large excess of water (e.g., ten fold excess, deionized water) and can be collected by, for example, filtration (e.g., fritted, medium porosity glass funnel). The reaction product can be precipitated, whereas the undesired reaction product (e.g., lithium nitrate) can be water soluble and, hence, remain in aqueous solution. The amount of the lithium in the reaction product can be, for example, undetectable by methods such as ICP-MS. For example, the amount of undesired metal such as lithium can be less than 1 wt. %, or less than 0.1 wt. %, or less than 0.01 wt. %, or less than 0.001 wt. %. In this method, elaborate extraction procedures can be avoided. For example, Soxhlett extraction can be avoided. The yield of silver salt product can be, for example, at least about 70%, or at least 80%, or at least 85%, such as for example, 80% to 85%.

Hence, one embodiment comprises a method comprising: (i) providing at least one tetraarylborate salt, optionally in a solution, (ii) providing at least one silver salt different from the tetraarylborate salt, optionally in a solution, wherein either the tetraaryl borate salt, or the silver salt, or both are in solution, (iii) combining the tetraarylborate salt with the silver salt to precipitate a silver tetraarylborate salt from a precipitation medium, and (iv) collect the silver tetraarylborate salt to separate it from the precipitation medium. The method can comprise a metathesis exchange reaction, wherein the desired product is not soluble in the precipitation medium (e.g., not water soluble) and the undesired product is soluble in the precipitation medium (e.g., is water soluble Another embodiment comprises a method comprising: (i) providing at least one first solution of at least one tetraarylborate salt, (ii) providing at least one second solution of at least one silver salt different from the tetraarylborate salt, (iii) combining the first and second solutions to precipitate a silver tetraarylborate salt from a precipitation medium, and (iv) collect the silver tetraarylborate salt to separate it from the precipitation medium.

The method can comprise a metathesis exchange reaction, wherein the desired product is not soluble in the precipitation medium (e.g., not water soluble) and the undesired product is soluble in the precipitation medium (e.g. is water soluble).

At least one polar organic solvent can be used such as, for example, acetonitrile for the metathesis reaction. The solvent can be miscible with water. The polar organic solvent can be also selected to complex with silver salts and form complexes. For example, some complexes of silver may be more stable than other complexes. For example, some complexes may provide more photolytic stability and provide for white complexes which remain white over time.

Devices (and Methods of Using)

Methods known in the art can be used to fabricate organic electronic devices including, for example, OLED and OPV devices. Methods known in the art can be used to measure brightness, efficiency, and lifetimes. OLED patents include for example U.S. Pat. Nos. 4,356,429 and 4,539,507 (Kodak). Conducting polymers which emit light are described in, for example, U.S. Pat. Nos. 5,247,190 and 5,401,827 (Cambridge Display Technologies). See also Kraft et al., "Electroluminescent Conjugated Polymers—Seeing Polymers in a New Light," Angew. Chem. Int. Ed., 1998, 37, 402-428, including device architecture, physical principles, solution processing, multilayering, blends, and materials synthesis and formulation, which is hereby incorporated by reference in its entirety.

Light emitters known in the art and commercially available can be used including various conducting polymers as well as organic molecules, such as materials available from Sumation, Merck Yellow, Merck Blue, American Dye Sources (ADS), Kodak (e.g, A1Q3 and the like), and even Aldrich such as BEHP-PPV. Examples of such organic electroluminescent materials include:

(i) poly(p-phenylene vinylene) and its derivatives substituted at various positions on the phenylene moiety;

(ii) poly(p-phenylene vinylene) and its derivatives substituted at various positions on the vinylene moiety;

(iii) poly(p-phenylene vinylene) and its derivatives substituted at various positions on the phenylene moiety and also substituted at various positions on the vinylene moiety;

(iv) poly(arylene vinylene), where the arylene may be such moieties as naphthalene, anthracene, furylene, thienylene, oxadiazole, and the like;

(v) derivatives of poly(arylene vinylene), where the arylene may be as in (iv) above, and additionally have substituents at various positions on the arylene;

(vi) derivatives of poly(arylene vinylene), where the arylene may be as in (iv) above, and additionally have substituents at various positions on the vinylene;

(vii) derivatives of poly(arylene vinylene), where the arylene may be as in (iv) above, and additionally have substituents at various positions on the arylene and substituents at various positions on the vinylene;

(viii) co-polymers of arylene vinylene oligomers, such as those in (iv), (v), (vi), and (vii) with non-conjugated oligomers; and (ix) polyp-phenylene and its derivatives substituted at various positions on the phenylene moiety, including ladder polymer derivatives such as poly(9,9-dialkyl fluorene) and the like;

(x) poly(arylenes) where the arylene may be such moieties as naphthalene, anthracene, furylene, thienylene, oxadiazole, and the like; and their derivatives substituted at various positions on the arylene moiety;

(xi) co-polymers of oligoarylenes such as those in (x) with non-conjugated oligomers;

(xii) polyquinoline and its derivatives;

(xiii) co-polymers of polyquinoline with p-phenylene substituted on the phenylene with, for example, alkyl or alkoxy groups to provide solubility; and (xiv) rigid rod polymers such as poly(p-phenylene-2,6-benzobisthiazole), poly(p-phenylene-2,6-benzobisoxazole), polyp-phenylene-2,6-benzimidazole), and their derivatives.

(xv) polyfluorene polymers and co-polymers with polyfluorene units

Preferred organic emissive polymers include SUMATION Light Emitting Polymers ("LEPs") that emit green, red, blue, or white light or their families, copolymers, derivatives, or mixtures thereof; the SUMATION LEPs are available from Sumation KK. Other polymers include polyspirofluorene-like polymers available from Covion Organic Semiconductors GmbH, Frankfurt, Germany (now owned by Merck®).

Alternatively, rather than polymers, small organic molecules that emit by fluorescence or by phosphorescence can serve as the organic electroluminescent layer. Examples of small-molecule organic electroluminescent materials include: (i) tris(8-hydroxyquinolinato) aluminum (Alq); (ii) 1,3-bis(N,N-dimethylaminophenyl)-1,3,4-oxidazole (OXD-8); (iii) -oxo-bis(2-methyl-8-quinolinato)aluminum; (iv) bis (2-methyl-8-hydroxyquinolinato) aluminum; (v) bis(hydroxybenzoquinolinato) beryllium (BeQ.sub.2); (vi) bis (diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687 issued to VanSlyke; and Bredas, J.-L., Silbey, R., eds., *Conjugated Polymers*, Kluwer Academic Press, Dordrecht (1991).

Examples of HIL in devices include:

1) Hole injection in OLEDs including PLEDs and SMOLEDs; for example, for HIL in PLED, all classes of conjugated polymeric emitters where the conjugation involves carbon or silicon atoms can be used. For HIL in SMOLED, the following are examples: SMOLED containing fluorescent emitters; SMOLED containing phosphorescent emitters; SMOLEDs comprising one or more organic layers in addition to the HIL layer; and SMOLEDs where the small molecule layer is processed from solution or aerosol spray or any other processing methodology. In addition, other examples include HIL in dendrimer or oligomeric organic semiconductor based OLEDs; HIL in ambipolar light emitting FET's where the HIL is used to modify charge injection or as an electrode;

2) Hole extraction layer in OPV:

3) Channel material in transistors

4) Channel material in circuits comprising a combination of transistors such as logic gates 5) Electrode material in transistors 6) Gate layer in a capacitor 7) Chemical sensor where modification of doping level is achieved due to association of the species to be sensed with the conductive polymer.

A variety of photoactive layers can be used in OPV devices. Photovoltaic devices can be prepared with photoactive layers comprising fullerene derivatives mixed with for example conducting polymers as described in for example U.S. Pat. No. 5,454,880 (Univ. Cal.); U.S. Pat. No. 6,812,399; and 6,933, 436. See also, for example, Wienk et al., *Applied Physics Letters*, 88, 153511 (2006); Campos et al., *Solar Energy Materials & Solar Cells*, 90 (2006) 3531-3546. Also, photoactive layers may comprise blends of conducting polymers, blends of conducting polymers and semiconducting nanoparticles, and bilayers of small molecules such as pthalocyanines, fullerenes, and porphyrins.

Common electrode materials and substrates, as well as encapsulating materials can be used.

In one embodiment, the cathode comprises Au, Ca, Al, Ag, or combinations thereof. In one embodiment, the anode comprises indium tin oxide. In one embodiment, the light emission layer comprises at least one organic compound.

Interfacial modification layers and optical spacer layers can be used.

Electron transport layers can be used.

A method of making a device typically comprises the steps of providing a substrate; layering a transparent conductor on the substrate; providing an HIL or HTL ink composition comprising a conjugated polymer doped with a dopant in a solvent as described herein; layering the composition on the transparent conductor to form a hole injection layer or hole transport layer; layering an active layer on the hole injection layer or hole transport layer; and layering a cathode on the active layer.

In another embodiment, a method of making a device comprises applying an HIL or HTL ink composition comprising a conjugated polymer doped with a dopant in a solvent as described herein as part of an HIL or HTL layer in an OLED, a photovoltaic device, an ESD, a SMOLED, a PLED, a sensor, a supercapacitor, a cation transducer, a drug release device, an electrochromic device, a transistor, a field effect transistor, an electrode modifier, an electrode modifier for an organic field transistor, an actuator, or a transparent electrode.

Properties of Composition and Devices

An important property is thermal stability. Thermal stability can be measured by one or more thermal analysis methods such as, for example, thermal gravimetric analysis (TGA).

Additional Embodiment

To a solution of a polymer such as, for example, poly(3,4-(dibutoxyethoxyethoxy)thiophene)) in a solvent such as, for example, tetrahydropyran, a metal such as, for example, a silver powder (e.g., 5-8 microns, 0.5 g 120 mL) can be added. The appropriate amount of dopant such as, for example, silver tetrakis(pentafluorophenyl)borate can be dissolved in solvent such as tetrahydropyran and then added (e.g., dropwise) until completion of addition with very good agitation. The mixture can be further agitated at, for example, room temperature for an additional time such as, for example, 30 min. Following this, a second solvent or solvent mixture with a boiling point higher than the first solvent, e.g., tetrahydropyran, can be added to the mixture and the contents further stirred overnight at room temperature. The formulation can be then filtered to get rid-off the silver powder using, for example, a glass filter (e.g., 0.45 micron pore size). The solvent, e.g., tetrahydropyran, can be then pumped out under reduced pressure while maintaining the temperature below, for example, 30° C.

The following non-limiting working examples further illustrate different embodiments.

WORKING EXAMPLES

Working Example 1

Exemplary compositions, for example, ink compositions of the present embodiments were prepared according to general procedures 1A-1F below as follows:

General Procedure 1A

A solution of poly(3,4-(dibutoxyethoxyethoxy) thiophene)) was prepared in the select solvent by stirring at room temperature for 30-60 min. Silver tetrakis(pentafluorophenyl)borate was dissolved in the same solvent and then added dropwise to the solution with agitation. The mixture was stirred for 30-60 min at room temperature and then filtered through a bed of celite.

General Procedure 1B

A solution of poly(3,4-(dibutoxyethoxyethoxy) thiophene)) was prepared in tetrahydropyran at 0.5% solids by stirring at room temperature for 30-60 min. Silver tetrakis (pentafluorophenyl)-borate dissolved in tetrahydropyran at 0.5% solids was added dropwise with agitation. The mixture was stirred at room temperature for an additional 30 min and then filtered through a bed of celite as described above. The solid content at this point is between 0.35 and 0.45%. The solution was then concentrated to the desired concentration (example, 1.25%) at low pressure while keeping the temperature below 25° C.

General Procedure 1C

A solution of poly(3,4-(dibutoxyethoxyethoxy) thiophene)) was prepared in tetrahydropyran at 0.5% solids by stirring at room temperature for 30-60 min. About 0.5 g of silver powder (5-8 micron) was added per 20 mL of solution. Silver tetrakis(pentafluorophenyl)borate dissolved in tetrahydropyran at 0.5% solids was added to the solution dropwise with agitation. The mixture was stirred at room temperature for an additional 30 min and filtered through a bed of celite. The solid content at this point was between 0.35 and 0.45%. The solution was then concentrated to the desired concentration (example, 1.25%) at low pressure while keeping the temperature below 25° C.

General Procedure 1D

A solution of poly(3,4-(dibutoxyethoxyethoxy) thiophene)) was prepared in tetrahydropyran at 0.5% solids by stirring at room temperature for 30-60 min. About 0.5 g of silver powder (5-8 micron) was added per 20 mL of solution. Silver tetrakis(pentafluorophenyl)borate dissolved in tetrahydropyran at 0.5% solids was added to the solution dropwise with agitation. The mixture was stirred at room temperature for an additional 30 min and filtered through two to three stacked 0.5 micron glass fiber filters. The solid content at this point was between 0.35 and 0.45%. The solution was then concentrated to the desired concentration (example, 1.25%) at low pressure while keeping the temperature below 25° C.

General Procedure 1E

The tetrahydropyran of procedures 1B, 1C or 1D may be substituted with a higher boiling solvent shown in Table 1, and further concentrated at low pressure while maintaining the temperature <25° C. from an initial 1% solution. The final concentration of the solution in the higher boiling solvent may be selected from 1, 1.25, 1.5, 1.75 or 2.0%.

TABLE 1

| Tetrahydronaphthalene | 66.67% | 3-Methoxypropionitrile | 33.33% |
|---|---|---|---|
| 4-Methylanisole | 66.67% | 3-Methoxypropionitrile | 33.33% |

Alternatively, the tetrahydronaphthalene can be replaced with o-xylene, mesitylene, or other alkylbenzenes.

General Procedure 1F: Addition of Matrix Materials

Matrix material may be added to the compositions. For example, a stock solution of a matrix polymer or small molecule additives may be prepared in the same solvent as the doped ink prepared via method 1A-1E. The matrix material may then be added to the doped ink with or without stirring. Alternatively, the matrix material may be prepared in a solvent different than that of the doped ink, for example, a solvent comprising 3-methoxy propionitrile.

General Procedure 1G: Re-Dissolution of Dried Polymer

The doped ink may be formed into a dry powder comprising the doped polymer by solvent evaporation, precipitation in non-solvent, or by spray drying. The dry powder can be easier to transport and to store than its corresponding ink solution. The dry powder may then be added to various solvents depending on the application. For example, the dry powder may be added to solvents appropriate for coating applications such as gravure, ink jet, and slot die.

In one example, a dry powder comprising a doped polymer may be redissolved. For example, a 9.755 g of doped polymer ink prepared via procedure 1D was placed in a one necked 50 mL round bottomed flask. The solvent was evaporated at 25° C. on a rotary evaporator under vacuum. The dry solids were exposed to a vacuum 1 torr) for 1 minute.

The net weight of the flask at this stage was 0.047 g. Then, about 3.086 g of a mixture of 1,2,3,4-tetrahydronaphthalene and 3-methoxypropionitrile in a 2:1 wt/wt ratio was added to the flask and the contents mixed using a stirbar for about 10-15 min. A dark colored solution was then filtered through a 0.45 μm PTFE syringe filter. No resistance or hang-up in the filter was observed during the filtration.

Example 1H

To a stock solution of poly(3,4-(dibutoxyethoxyethoxy) thiophene)) in tetrahydropyran (1.75% total solids), about 0.5 gms of silver powder (5-8 micron) was added. To the above solution, 9.886 gm of silver tetrakis(pentafluorophenyl)borate dissolved in tetrahydropyran (1.75% total solids) was then added dropwise until completion of addition while stirring the solution vigorously. Upon completion of addition of dopant, the mixture was further agitated at room temperature for an additional 30 min. Following this, 20 gms of a mixture of tetralin and 3-methoxypropionitrile (2:1 wt/wt) was added and continued stirring overnight at room temperature. The formulation was then filtered using a 2.7 micron glass fiber filter and then again using a 2.7 micron glass filter and glass syringe filter (0.45 micron pore size). The tetrahydropyran was then pumped out under reduced pressure while maintaining the temperature below 30° C.

Working Example 2

Making of the Dopant 5.8 g of Lithium tetrakis(pentafluorophenyl) borate diethyl ether complex was added to an Erlenmeyer flask covered with aluminum foil. 110.2 g of acetonitrile was added to make a 5% solution. The contents were stirred for about 5 minutes at room temperature (RT) until all the solids were dissolved. To this solution, 1.3619 g of $AgNO_3$ was added in solid form. The reaction mixture was stirred at room temperature for 2 hrs and the solution was added drop-wise (very slow addition—syringe and needle. Rate=200 mL/2.5 hrs) to 1300 mL of de-ionized (DI) water in an aluminum foil covered vessel with vigorous stirring. The aqueous layer was stirred for an additional 30 min and left to stand still for the precipitate to settle over 24-36 hrs. Alternatively, the solution can be centrifuged after standing overnight. The supernatant aqueous layer was decanted and a white precipitate was filtered and washed with 15 mL×2 DI water. The precipitated salt was further stirred in 50 mL of DI water at RT for 30 min, filtered and washed with 15 mL×2 DI water. In another example, washing may be done with about 300 mL DI water in several small portions while solids were in funnel. The slurry was filtered and washed an additional 2 times before suction drying on a funnel, followed by overnight drying in vacuo. The solids were pulverized and vacuum drying was continued for another 24 hrs or until the sample remained at a relatively constant weight.

Working Example 3

Unipolar Device Fabrication

The unipolar, single charge-carrier devices described herein were fabricated on indium tin oxide (ITO) surfaces deposited on glass substrates. The ITO surface was pre-patterned to define the pixel area of 0.05 $cm^2$. The device substrates were cleaned by ultrasonication in a dilute soap solution for 20 minutes each followed by distilled water washes. This was followed by ultrasonication in isopropanol for 20 minutes. The substrates were dried under nitrogen flow, following which they were treated in a UV-Ozone chamber operating at 300 W for 20 minutes.

The cleaned substrates were then coated with an HIL ink and dried at 90-170° C. for 5-15 minutes to form an HIL layer. Dry film thicknesses ranged from approximately 20 nm to 60 nm. The coating process was done on a spin coater but can be similarly achieved with spray coating, ink-jetting, contact printing or any other deposition method capable of resulting in an HIL film of the desired thickness. The substrates were then transferred to a vacuum chamber where the remaining layers of the device stack were deposited by means of physical vapor deposition.

In one example, N,N'(di naphthalen-1-yl)-N,N'-diphenyl-benzidine (NPB) a hole transporting layer (HTL) was deposited on top of the HIL followed by a Gold (Au) cathode. This is a unipolar device wherein the hole only injection efficiency of the HIL into the HTL is studied.

In this example, the cathode layer was prepared by the deposition of a 200 nm gold metal layer, at about 0.5 nm/sec with the base pressure at $5 \times 10^{-7}$ Torr.

The devices thus obtained were encapsulated with a glass cover slip to prevent exposure to ambient conditions by means of a UV-light curing epoxy resin cured at 80 W/$cm^2$ UV exposure for 4 minutes.

Working Example 4

Unipolar Device Testing

The unipolar device comprise pixels on a glass substrate whose electrodes extended outside the encapsulated area of the device which contain the light emitting portion of the pixels. The typical area of each pixel is 0.05 $cm^2$. The electrodes were contacted with a current source meter such as a Keithley 2400 source meter with a bias applied to the indium tin oxide electrode while the gold electrode was earthed. This results in only positively charged carriers (holes) being injected into the device (hole-only device). In this example, the HIL assists the injection of charge carriers into the hole transporting layer. This results in a low operating voltage of the device (defined as the voltage required to run a given current density through the pixel).

Figure 3:
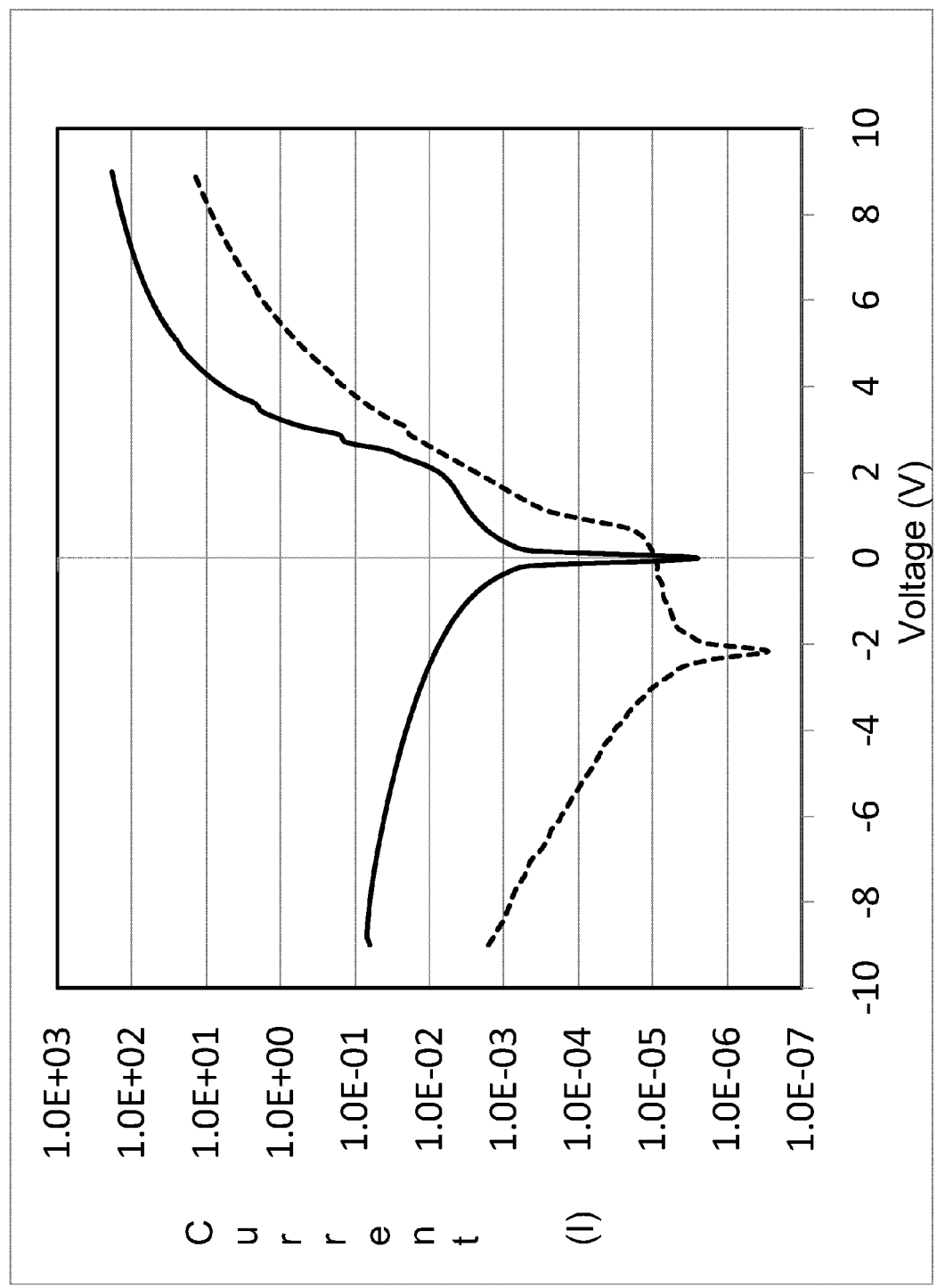
FIG. 3 illustrates IV Curve comparison of an exemplary unipolar device (solid line) and a comparative unipolar device (dashed line)

FIG. 3 shows IV curves of a hole only device with NPB as the HTL and gold cathode. The solid line indicates results for an exemplary device comprising HILs prepared using Silver tetrakis(pentafluoro phenyl)borate (AgTPFB). The dashed line indicates results for a comparative device comprising an HIL prepared using with p-cumenyl(p-tolyl)iodonium tetrakis(pentafluorophenyl)borate.

Clearly the hole currents observed with the AgTFPB sample are much higher at the same voltage than its hypervalent iodonium counter-part indicating much better hole-injection capabilities.

Example 5

Device Testing Using HIL Formulations Prepared in Example 1

An HIL layer according to working example 1C was used in an OLED. OLEDs were prepared using the following procedure: The OLED devices described herein were fabricated on indium tin oxide ("ITO") surfaces deposited on glass substrates. The ITO surface was pre-patterned to define the pixel area of 0.09 $cm^2$. The device substrates were cleaned by ultrasonication in a dilute soap solution for 20 minutes each followed by distilled water washes. This was followed by ultrasonication in isopropanol for 20 minutes. The substrates were dried under nitrogen flow, following which they were treated in a UV-Ozone chamber operating at 300 W for 20 minutes.

The cleaned substrates were then coated with an HIL ink and dried at 90-170° C. for 5-15 minutes to form an HIL layer. Dry film thicknesses ranged from approximately 20 nm to 60 nm. The coating process was done on a spin coater but can be similarly achieved with spray coating, ink-jetting, contact printing or any other deposition method capable of resulting in an HIL film of the desired thickness. The substrates were then transferred to a vacuum chamber where the remaining layers of the device stack were deposited by means of physical vapor deposition.

In this example, the layers deposited on top of the HIL include a hole transporting layer (HTL), an emissive layer (EML), a hole blocking layer (HBL), an electron transporting layer (ETL), and a metal cathode. The materials used in this example were N,N'(di naphthalen-1-yl)-N,N'-diphenyl-benzidine (NPB) as the HTL (30 nm), proprietary host doped with Tris(2-phenylquinoline)iridium(III) (Ir(2-phq)3) for the EML (30 nm), Bis(2-methyl-8-quinolinolato-N1,O8)-(1,1'-Biphenyl-4-olato)aluminum (BAlq) as the HBL (10 nm), and 4,7-Diphenyl-1,10-phenanthroline (BPhen) doped with Cesium carbonate (CsCO3) as the ETL (45 nm) o respectively.

Also in this example, the cathode layer was prepared by thermal evaporation. The layer consisted of a single layer of 200 nm thick aluminum (0.5 nm/sec) evaporated with a base pressure of $5 \times 10^{-7}$ Torr.

The devices thus obtained were encapsulated with a glass cover slip to prevent exposure to ambient conditions by means of a UV-light curing epoxy resin cured at 80 W/cm$^2$ UV exposure for 4 minutes.

OLED Testing

The OLEDs comprised pixels on a glass substrate whose electrodes extended outside the encapsulated area of the device which contain the light-emitting portion of the pixels. The typical area of each pixel is 0.09 cm$^2$. The electrodes were contacted with a current source meter such as a Keithley 2400 source meter with a bias applied to the indium tin oxide electrode while the aluminum electrode was earthed. This resulted in positively charged carriers (holes) and negatively charged carriers being injected into the device which form excitons and generate light. In this example, the HIL assisted the injection of charge carriers into the light emitting layer. This resulted in a low operating voltage of the device (defined as the voltage required to run a given current density through the pixel).

Simultaneously, another Keithley 2400 source meter was used to address a large area silicon photodiode. This photodiode was maintained at zero volts bias by the 2400 source meter. It was placed in direct contact with area of the glass substrate directly below the lighted area of the OLED pixel. The photodiode collected the light generated by the OLED converting them into photocurrent which was in turn read by the source meter. The photodiode current generated was quantified into optical units (candelas/sq. meter) by calibrating it with the help of a Minolta CS-200 Chromameter.

During the testing of the device, the Keithley 2400 addressing the OLED pixel applied a voltage sweep to it. The resultant current passing through the pixel was measured. At the same time the current passing through the OLED pixel results in light being generated which then results in a photocurrent reading by the other Keithley 2400 connected to the photodiode. Thus the voltage-current-light or IVL data for the pixel was generated. This in turn enabled the measurement of other device characteristics such as the lumens per Watt of electrical input power to the pixel and candelas per ampere of pixel current.

The performance of different HILs in different example OLED types is described. Note that typically performance is quantified by a combination of different parameters such as operating voltage (should be low), brightness in nits (should be bright), and luminous efficiency in units of cd/A (reflecting how much electric charge is needed to obtain light from the device). As such, the overall performance is very important in a comparative evaluation of HIL performance.

In the examples below, the voltages and efficiencies that are provided were measured at a fixed current density of 10 mA/cm$^2$. Data collected for each device are shown in Table 2 below.

The comparative example used below in Table 2 is an ink prepared from*:

| Component | Weight % |
| --- | --- |
| Poly(thiophene-3-[2-(2-methoxyethoxy)ethoxy]-2,5-diyl), sulfonated | 0.14 |
| Poly(4-vinylphenol) | 1.86 |
| Water | 63.7 |
| Ethylene glycol monobutyl ether | 34.3 |

*See, for example, US Patent Publication 2008/0248313 to Seshadri et al., published Oct. 9, 2008 (assignee: Plextronics).

TABLE 2

| | @ 1000 nits | | | | @ 10 mA/cm$^2$ | | Life-time | | | |
| --- | --- | --- | --- | --- | --- | --- | --- | --- | --- | --- |
| Composition | Voltage | cd/A | lm/watt | EQE | CIE (x,y) | V | cd/A | Initial luminance | V$_0$ | LT$_{80}$ (h) | dv/dt @ LT80 |
| Comparative example | 3.07 | 11.5 | 11.77 | 5.99 | (0.59, 0.41) | 3.12 | 11.08 | 8121 | 0.5 | 52 | 0.5 |
| Example* | 2.97 | 12.02 | 12.72 | 6.18 | (0.59, 0.41) | 3.04 | 11.18 | 8073 | 0.36 | 63 | 0.36 |

*Hole injection layer was prepared using general procedures 1A and 1C in tetrahydropyran at 1.25% total solids.

Additional Examples

Additional examples for ink formulations are disclosed in Table 3 below.

TABLE 3

| Composition # | Components | wt % |
| --- | --- | --- |
| 1 | poly(3,4-bis(2-(2-butoxyethoxy)ethoxy)thiophene) | 1.682 |
| | Silver tetrakis(pentafluorophenyl)borate | 0.318 |
| | Toluene | 65.270 |
| | 3-Methoxypropionitrile | 32.730 |
| 2 | poly(3,4-bis(2-(2-butoxyethoxy)ethoxy)thiophene) | 1.451 |
| | Silver tetrakis(pentafluorophenyl)borate | 0.549 |
| | Toluene | 65.270 |
| | 3-Methoxypropionitrile | 32.730 |
| 3 | poly(3,4-bis(2-(2-butoxyethoxy)ethoxy)thiophene) | 1.276 |
| | Silver tetrakis(pentafluorophenyl)borate | 0.724 |
| | Toluene | 65.270 |
| | 3-Methoxypropionitrile | 32.730 |
| 4 | poly(3,4-bis(2-(2-butoxyethoxy)ethoxy)thiophene | 1.138 |
| | Silver tetrakis(pentafluorophenyl)borate | 0.862 |
| | Toluene | 65.270 |
| | 3-Methoxypropionitrile | 32.730 |
| 5 | poly(3,4-bis(2-(2-butoxyethoxy)ethoxy)thiophene) | 1.028 |

TABLE 3-continued

| Composition # | Components | wt % |
|---|---|---|
| | Silver tetrakis(pentafluorophenyl)borate | 0.972 |
| | Toluene | 65.270 |
| | 3-Methoxypropionitrile | 32.730 |
| 6 | poly(3,4-bis(2-(2-butoxyethoxy)ethoxy)thiophene) | 0.788 |
| | Silver tetrakis(pentafluorophenyl)borate | 0.462 |
| | o-xylene | 65.827 |
| | 3-Methoxypropionitrile | 32.923 |
| 7 | poly(3,4-bis(2-(2-butoxyethoxy)ethoxy)thiophene) | 0.701 |
| | Silver tetrakis(pentafluorophenyl)borate | 0.549 |
| | o-xylene | 65.827 |
| | 3-Methoxypropionitrile | 32.923 |
| 8 | poly(3,4-bis(2-(2-butoxyethoxy)ethoxy)thiophene) | 0.632 |
| | Silver tetrakis(pentafluorophenyl)borate | 0.618 |
| | o-xylene | 65.767 |
| | 3-Methoxypropionitrile | 32.983 |
| 9 | poly(3,4-bis(2-(2-butoxyethoxy)ethoxy)thiophene) | 0.575 |
| | Silver tetrakis(pentafluorophenyl)borate | 0.675 |
| | o-xylene | 65.767 |
| | 3-Methoxypropionitrile | 32.983 |
| 10 | poly(3,4-bis(2-(2-butoxyethoxy)ethoxy)thiophene) | 0.526 |
| | Silver tetrakis(pentafluorophenyl)borate | 0.411 |
| | Poly(4-hexyloxystyrene-co-4-hydroxystyrene) | 0.313 |
| | o-Xylene | 65.833 |
| | 3-Methoxypropionitrile | 32.917 |
| 11 | poly(3,4-bis(2-(2-butoxyethoxy)ethoxy)thiophene) | 0.351 |
| | Silver tetrakis(pentafluorophenyl)borate | 0.274 |
| | Poly(4-hexyloxystyrene-co-4-hydroxystyrene) | 0.625 |
| | o-Xylene | 65.833 |
| | 3-Methoxypropionitrile | 32.917 |
| 12 | poly(3,4-bis(2-(2-butoxyethoxy)ethoxy)thiophene) | 0.175 |
| | Silver tetrakis(pentafluorophenyl)borate | 0.137 |
| | Poly(4-hexyloxystyrene-co-4-hydroxystyrene) | 0.938 |
| | o-Xylene | 65.833 |
| | 3-Methoxypropionitrile | 32.917 |
| 13 | poly(3,4-bis(2-(2-butoxyethoxy)ethoxy)thiophene) | 1.403 |
| | Silver tetrakis(pentafluorophenyl)borate | 1.097 |
| | Tetrahydropyran | 65.000 |
| | 3-Methoxypropionitrile | 32.500 |
| 14 | poly(3,4-bis(2-(2-butoxyethoxy)ethoxy)thiophene) | 0.631 |
| | Silver tetrakis(pentafluorophenyl)borate | 0.494 |
| | Poly(4-hydroxystyrene) | 0.375 |
| | Tetrahydropyran | 65.603 |
| | 3-Methoxypropionitrile | 32.897 |
| 15 | poly(3,4-bis(2-(2-butoxyethoxy)ethoxy)thiophene) | 0.421 |
| | Silver tetrakis(pentafluorophenyl)borate | 0.329 |
| | Poly(4-hydroxystyrene) | 0.750 |
| | Tetrahydropyran | 65.603 |
| | 3-Methoxypropionitrile | 32.897 |
| 16 | poly(3,4-bis(2-(2-butoxyethoxy)ethoxy)thiophene) | 0.210 |
| | Silver tetrakis(pentafluorophenyl)borate | 0.165 |
| | Poly(4-hydroxystyrene) | 1.125 |
| | Tetrahydropyran | 65.603 |
| | 3-Methoxypropionitrile | 32.897 |
| 17 | poly(3,4-bis(2-(2-butoxyethoxy)ethoxy)thiophene) | 0.175 |
| | Silver tetrakis(pentafluorophenyl)borate | 0.137 |
| | N,N'-diphenyl-N,N'-bis(4-triisopropylsilyloxyphenyl)benzene-1,4-diamine | 0.938 |
| | o-Xylene | 65.768 |
| | 3-Methoxypropionitrile | 32.983 |
| 18 | poly(3,4-bis(2-(2-butoxyethoxy)ethoxy)thiophene) | 0.351 |
| | Silver tetrakis(pentafluorophenyl)borate | 0.274 |
| | N,N'-diphenyl-N,N'-bis(4-triisopropylsilyloxyphenyl)benzene-1,4-diamine | 0.625 |
| | o-Xylene | 65.768 |
| | 3-Methoxypropionitrile | 32.983 |
| 19 | poly(3,4-bis(2-(2-butoxyethoxy)ethoxy)thiophene) | 0.526 |
| | Silver tetrakis(pentafluorophenyl)borate | 0.411 |
| | N,N'-diphenyl-N,N'-bis(4-triisopropylsilyloxyphenyl)benzene-1,4-diamine | 0.313 |
| | o-Xylene | 65.768 |
| | 3-Methoxypropionitrile | 32.983 |
| 20 | poly(3,4-bis(2-(2-butoxyethoxy)ethoxy)thiophene) | 0.510 |
| | Silver tetrakis(pentafluorophenyl)borate | 0.399 |
| | N,N'-bis(trifluorovinyloxyphenyl)-N,N''-diphenylbenzidine | 2.726 |
| | o-Xylene | 64.179 |
| | 3-Methoxypropionie | 32.186 |
| 21 | poly(3,4-bis(2-(2-butoxyethoxy)ethoxy)thiophene) | 0.624 |
| | Silver tetrakis(pentafluorophenyl)borate | 0.488 |
| | N,N'-bis(trifluorovinyloxyphenyl)-N,N''-diphenylbenzidine | 1.111 |
| | o-Xylene | 65.185 |
| | 3-Methoxypropionie | 32.593 |
| 22 | poly(3,4-bis(2-(2-butoxyethoxy)ethoxy)thiophene) | 0.673 |
| | Silver tetrakis(pentafluorophenyl)borate | 0.527 |
| | N,N'-bis(trifluorovinyloxyphenyl)-N,N''-diphenylbenzidine | 0.400 |
| | o-Xylene | 65.534 |
| | 3-Methoxypropionie | 32.866 |
| 23 | poly(3,4-bis(2-(2-butoxyethoxy)ethoxy)thiophene) | 0.460 |
| | Silver tetrakis(pentafluorophenyl)borate | 0.540 |
| | Tetrahydropyran | 66.000 |
| | 3-Methoxypropionitrile | 33.000 |
| 24 | poly(3,4-bis(2-(2-butoxyethoxy)ethoxy)thiophene) | 0.944 |
| | Silver tetrakis(pentafluorophenyl)borate | 0.306 |
| | o-Xylene | 65.833 |
| | 3-Methoxypropionitrile | 32.917 |
| 25 | poly(3,4-bis(2-(2-butoxyethoxy)ethoxy)thiophene) | 0.758 |
| | Silver tetrakis(pentafluorophenyl)borate | 0.492 |
| | o-Xylene | 65.833 |
| | 3-Methoxypropionitrile | 32.917 |
| 26 | poly(3,4-bis(2-(2-butoxyethoxy)ethoxy)thiophene) | 0.633 |
| | Silver tetrakis(pentafluorophenyl)borate | 0.617 |
| | o-Xylene | 65.833 |
| | 3-Methoxypropionitrile | 32.917 |
| 27 | poly(3,4-bis(2-(2-butoxyethoxy)ethoxy)thiophene) | 0.544 |
| | Silver tetrakis(pentafluorophenyl)borate | 0.706 |
| | o-Xylene | 65.833 |
| | 3-Methoxypropionitrile | 32.917 |
| 28 | poly(3,4-bis(2-(2-butoxyethoxy)ethoxy)thiophene) | 0.424 |
| | Silver tetrakis(pentafluorophenyl)borate | 0.826 |
| | o-Xylene | 65.833 |
| | 3-Methoxypropionitrile | 32.917 |
| 29 | poly(3,4-bis(2-(2-butoxyethoxy)ethoxy)thiophene) | 0.666 |
| | Silver tetrakis(pentafluorophenyl)borate | 0.521 |
| | Triethylammonium pyrenesulfonate | 0.063 |
| | o-Xylene | 65.768 |
| | 3-Methoxypropionitrile | 32.983 |
| 30 | poly(3,4-bis(2-(2-butoxyethoxy)ethoxy)thiophene) | 0.631 |
| | Silver tetrakis(pentafluorophenyl)borate | 0.494 |
| | Triethylammonium pyrenesulfonate | 0.125 |
| | o-Xylene | 65.768 |
| | 3-Methoxypropionitrile | 32.983 |
| 31 | poly(3,4-bis(2-(2-butoxyethoxy)ethoxy)thiophene) | 0.561 |
| | Silver tetrakis(pentafluorophenyl)borate | 0.439 |
| | Triethylammonium pyrenesulfonate | 0.250 |
| | o-Xylene | 65.768 |

TABLE 3-continued

| Composition # | Components | wt % |
|---|---|---|
| | 3-Methoxypropionitrile | 32.983 |
| 32 | poly(3,4-bis(2-(2-butoxyethoxy)ethoxy)thiophene) | 0.631 |
| | Silver tetrakis(pentafluorophenyl)borate | 0.494 |
| | Tetrahydropyran | 98.875 |
| 33 | poly(3,4-bis(2-(2-butoxyethoxy)ethoxy)thiophene) | 0.631 |
| | Silver tetrakis(pentafluorophenyl)borate | 0.494 |
| | Tetrahydropyran | 98.750 |
| | Triethylammonium pyrenesulfonate | 0.125 |
| 34 | poly(3,4-bis(2-(2-butoxyethoxy)ethoxy)thiophene) | 0.561 |
| | Silver tetrakis(pentafluorophenyl)borate | 0.439 |
| | Tetrahydropyran | 98.750 |
| | Triethylammonium pyrenesulfonate | 0.250 |
| 35 | poly(3,4-bis(2-(2-butoxyethoxy)ethoxy)thiophene) | 0.421 |
| | Silver tetrakis(pentafluorophenyl)borate | 0.329 |
| | Tetrahydropyran | 98.750 |
| | Triethylammonium pyrenesulfonate | 0.500 |
| 36 | poly(3,4-bis(2-(2-butoxyethoxy)ethoxy)thiophene) | 0.788 |
| | Silver tetrakis(pentafluorophenyl)borate | 0.462 |
| | Tetrahydropyran | 98.750 |
| 37 | poly(3,4-bis(2-(2-butoxyethoxy)ethoxy)thiophene) | 0.632 |
| | Silver tetrakis(pentafluorophenyl)borate | 0.618 |
| | Tetrahydropyran | 98.750 |
| 38 | poly(3,4-bis(2-(2-butoxyethoxy)ethoxy)thiophene) | 0.788 |
| | Silver tetrakis(pentafluorophenyl)borate | 0.462 |
| | Tetrahydropyran | 98.750 |
| 39 | poly(3,4-bis(2-(2-butoxyethoxy)ethoxy)thiophene) | 0.632 |
| | Silver tetrakis(pentafluorophenyl)borate | 0.618 |
| | Tetrahydropyran | 98.750 |
| 40 | poly(3,4-bis(2-(2-butoxyethoxy)ethoxy)thiophene) | 0.593 |
| | Silver tetrakis(pentafluorophenyl)borate | 0.907 |
| | Tetrahydropyran | 65.350 |
| | 3-Methoxypropionitrile | 33.150 |
| 41 | poly(3,4-bis(2-(2-butoxyethoxy)ethoxy)thiophene) | 0.526 |
| | Silver tetrakis(pentafluorophenyl)borate | 0.411 |
| | Trifluoromethyl methacrylate | 0.313 |
| | Tetrahydropyran | 65.770 |
| | 3-Methoxypropionitrile | 32.980 |
| 42 | poly(3,4-bis(2-(2-butoxyethoxy)ethoxy)thiophene) | 0.351 |
| | Silver tetrakis(pentafluorophenyl)borate | 0.274 |
| | Trifluoromethyl methacrylate | 0.625 |
| | Tetrahydropyran | 65.770 |
| | 3-Methoxypropionitrile | 32.980 |
| 43 | poly(3,4-bis(2-(2-butoxyethoxy)ethoxy)thiophene) | 0.175 |
| | Silver tetrakis(pentafluorophenyl)borate | 0.137 |
| | Trifluoromethyl methacrylate | 0.938 |
| | Tetrahydropyran | 65.770 |
| | 3-Methoxypropionitrile | 32.980 |
| 44 | poly(3,4-bis(2-(2-butoxyethoxy)ethoxy)thiophene) | 1.011 |
| | Silver tetrakis(pentafluorophenyl)borate | 0.989 |
| | Tetrahydropyran | 73.500 |
| | 3-Methoxypropionitrile | 24.500 |
| 45 | poly(3,4-bis(2-(2-butoxyethoxy)ethoxy)thiophene) | 1.011 |
| | Silver tetrakis(pentafluorophenyl)borate | 0.989 |
| | Tetrahydropyran | 88.200 |
| | 3-Methoxypropionitrile | 9.800 |
| 46 | poly(3,4-bis(2-(2-butoxyethoxy)ethoxy)thiophene) | 0.632 |
| | Silver tetrakis(pentafluorophenyl)borate | 0.544 |
| | Tetrahydropyran | 99.000 |
| 47 | poly(3,4-bis(2-(2-butoxyethoxy)ethoxy)thiophene) | 0.556 |
| | Silver tetrakis(pentafluorophenyl)borate | 0.544 |
| | Tetrahydropyran | 98.900 |
| 48 | poly(3,4-bis(2-(2-butoxyethoxy)ethoxy)thiophene) | 0.632 |
| | Silver tetrakis(pentafluorophenyl)borate | 0.618 |
| | Tetrahydropyran | 82.290 |
| | 3-Methoxypropionitrile | 16.460 |
| 49 | poly(3,4-bis(2-(2-butoxyethoxy)ethoxy)thiophene) | 0.632 |
| | Silver tetrakis(pentafluorophenyl)borate | 0.618 |
| | Tetrahydropyran | 92.825 |
| | 3-Methoxypropionitrile | 5.925 |
| 50 | poly(3,4-bis(2-(2-butoxyethoxy)ethoxy)thiophene) | 0.950 |
| | Silver tetrakis(pentafluorophenyl)borate | 0.930 |
| | Poly(4-vinylpyridine-co-styrene) | 0.620 |
| | Tetrahydropyran | 81.250 |
| | 3-Methoxypropionitrile | 16.250 |
| 51 | poly(3,4-bis(2-(2-butoxyethoxy)ethoxy)thiophene) | 0.584 |
| | Silver tetrakis(pentafluorophenyl)borate | 0.571 |
| | Poly(4-vinylpyridine-co-styrene) | 1.155 |
| | Tetrahydropyran | 81.41 |
| | 3-Methoxypropionitrile | 16.28 |
| 52 | poly(3,4-bis(2-(2-butoxyethoxy)ethoxy)thiophene) | 0.948 |
| | Silver tetrakis(pentafluorophenyl)borate | 0.927 |
| | poly(9,9-dioctyl-fluorene-co-N-(4-butylphenyl)-diphenylamine) | 0.625 |
| | Tetrahydropyran | 97.5 |
| 53 | poly(3,4-bis(2-(2-butoxyethoxy)ethoxy)thiophene) | 0.632 |
| | Silver tetrakis(pentafluorophenyl)borate | 0.618 |
| | poly(9,9-dioctyl-fluorene-co-N-(4-butylphenyl)-diphenylamine) | 1.25 |
| | Tetrahydropyran | 97.5 |

Finally, embodiments 1-67 were provided in U.S. provisional Ser. No. 61/333,657 filed May 11, 2010. These additional embodiments include:

Embodiment 1. A device comprising: at least one cathode, at least one anode, at least one light emission layer disposed between the cathode and anode, at least one hole injection layer disposed between the light emission layer and the anode, wherein the hole injection layer comprises a composition comprising: (i) at least one conjugated polymer, wherein the conjugated polymer is a 3-substituted alkoxy-polythiophene or a 3,4-substituted dialkoxy polythiophene; (ii) optionally, at least one matrix material different than (i); and (iii) at least one dopant for polymer (i), wherein the dopant does not substantially dope optional matrix material (ii), and the dopant comprises an ionic compound; wherein a cation of the ionic compound is gold, molybdenum, rhenium, iron, silver, or combinations thereof; and an anion of the ionic compound is represented by at least one of the following structures:

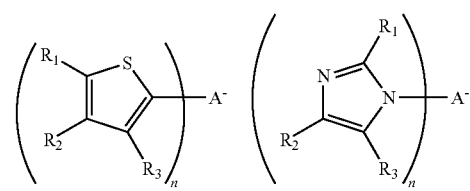

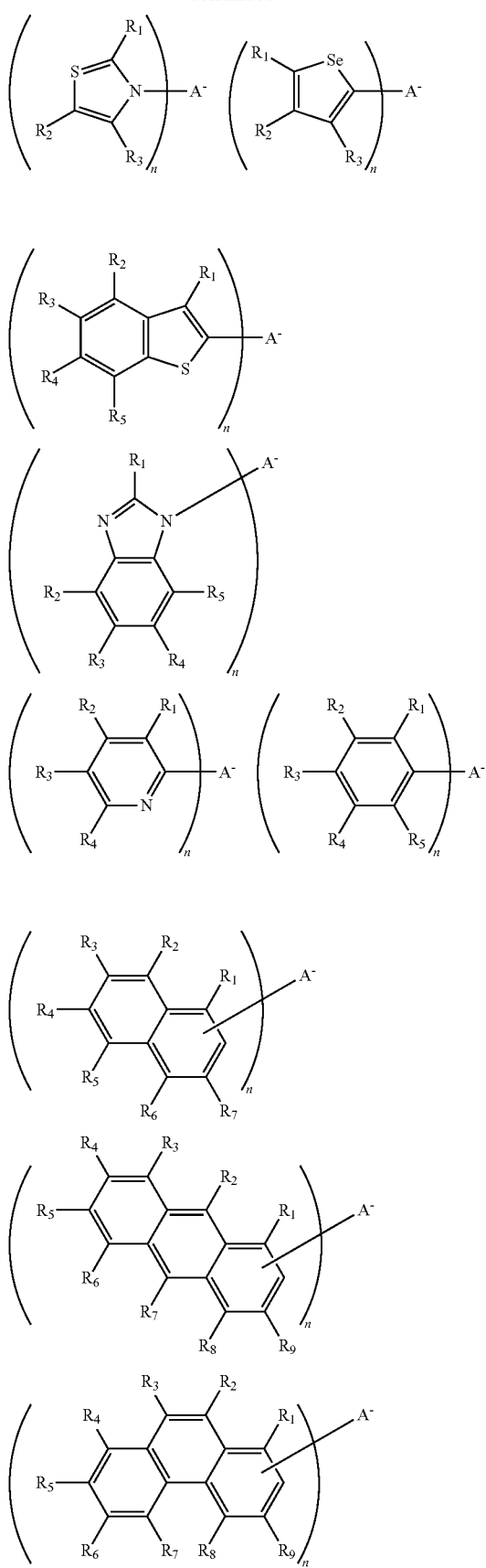

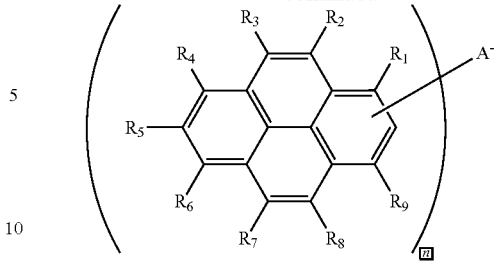

wherein independently, each of $R_1$ to $R_9$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, or antimony; and n is 1 to 6.

Embodiment 2. The device according to embodiment 1, wherein the anion is a tetrakis(halogenatedphenyl)borate.

Embodiment 3. The device according to embodiment 1 wherein the dopant comprises silver tetrakis(pentafluorophenyl)borate.

Embodiment 4. The device according to embodiment 1, wherein the conjugated polymer is a 3,4-substituted dialkoxypolythiophene.

Embodiment 5. The device according to embodiment 1, wherein the conjugated polymer is a 3-substituted alkoxypolythiophene, wherein the alkoxy group comprises one, two, three, four, or five oxygen atoms.

Embodiment 6. The device according to embodiment 1, wherein the conjugated polymer is a regioregular polythiophene.

Embodiment 7. The device according to embodiment 1, wherein the conjugated polymer is a non-regioregular polythiophene.

Embodiment 8. The device according to embodiment 1, wherein the matrix material is present.

Embodiment 9. The device according to embodiment 1, wherein the matrix material is present and comprises at least one synthetic organic polymer.

Embodiment 10. The device according to embodiment 1, wherein the matrix material is present and comprises an insulating or semiconducting planarizing agent.

Embodiment 11. The device according to embodiment 1, wherein the composition comprises between about 40% and 75% by weight conjugated polymer and between about 25% and 55% by weight dopant.

Embodiment 12. The device according to embodiment 1, wherein the composition comprises between about 50% and 65% conjugated polymer and between about 35% and 50% dopant.

Embodiment 13. The device according to embodiment 1, wherein the cathode comprises Au, Ca, Al, or combinations thereof.

Embodiment 14. The device according to embodiment 1, wherein the anode comprises indium tin oxide.

Embodiment 15. The device according to embodiment 1, where n the light emission layer comprises at least one organic compound.

Embodiment 16. The device according to embodiment 1, wherein the HIL layer has a thickness of about 20 nm to about 60 nm.

Embodiment 17. The device according to embodiment 1, wherein the HIL layer is thermally annealed.

Embodiment 18. The device according to embodiment 1, wherein the HIL layer is thermally annealed at temperature of about 90° C. to about 170° C. for about 5 to about 15 minutes.

Embodiment 19. The device according to embodiment 1, wherein the HIL layer does not comprise iodonium salt.

Embodiment 20. The device according to embodiment 1, wherein the dopant comprises silver tetrakis(pentafluorophenylborate) and wherein the conjugated polymer is the 3,4-substituted dialkoxypolythiophene polymer poly(3,4-(dibutoxyethoxyethoxy)thiophene) or poly(3,4-methoxyethoxyethoxy)thiophene).

Embodiment 21. A device comprising: at least one cathode, at least one anode, at least one light emission layer disposed between the cathode and anode, at least one hole injection layer disposed between the light emission layer and the anode, wherein the hole injection layer comprises a composition comprising: (i) at least one conjugated polymer, (ii) optionally, at least one matrix material different than (i); and at least one dopant for polymer (i), wherein the dopant does not substantially dope optional matrix material (ii), and the dopant increases the thermal stability of the HIL layer.

Embodiment 22. The device according to embodiment 21, wherein the thermal stability is improved as measured by thermogravimetric analysis.

Embodiment 23. The device according to embodiment 21, wherein the thermal stability is improved as measured by thermogravimetric analysis, wherein the dopant experiences a change in weight of less than about 5% across a temperature range between 0° C. and 150° C.

Embodiment 24. The device according to embodiment 21, wherein the dopant comprises an ionic compound, and wherein: a cation of the ionic compound is gold, molybdenum, rhenium, iron, or silver; and an anion of the ionic compound is at least one organic structure represented by:

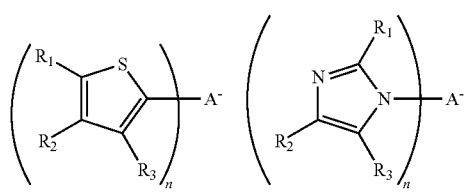

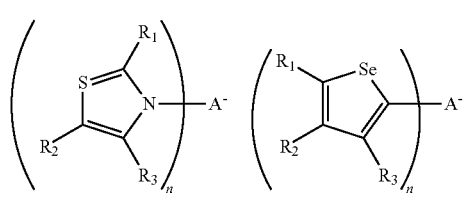

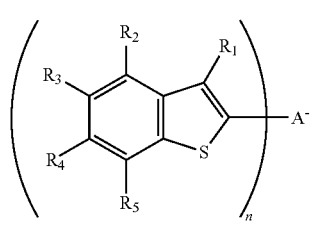

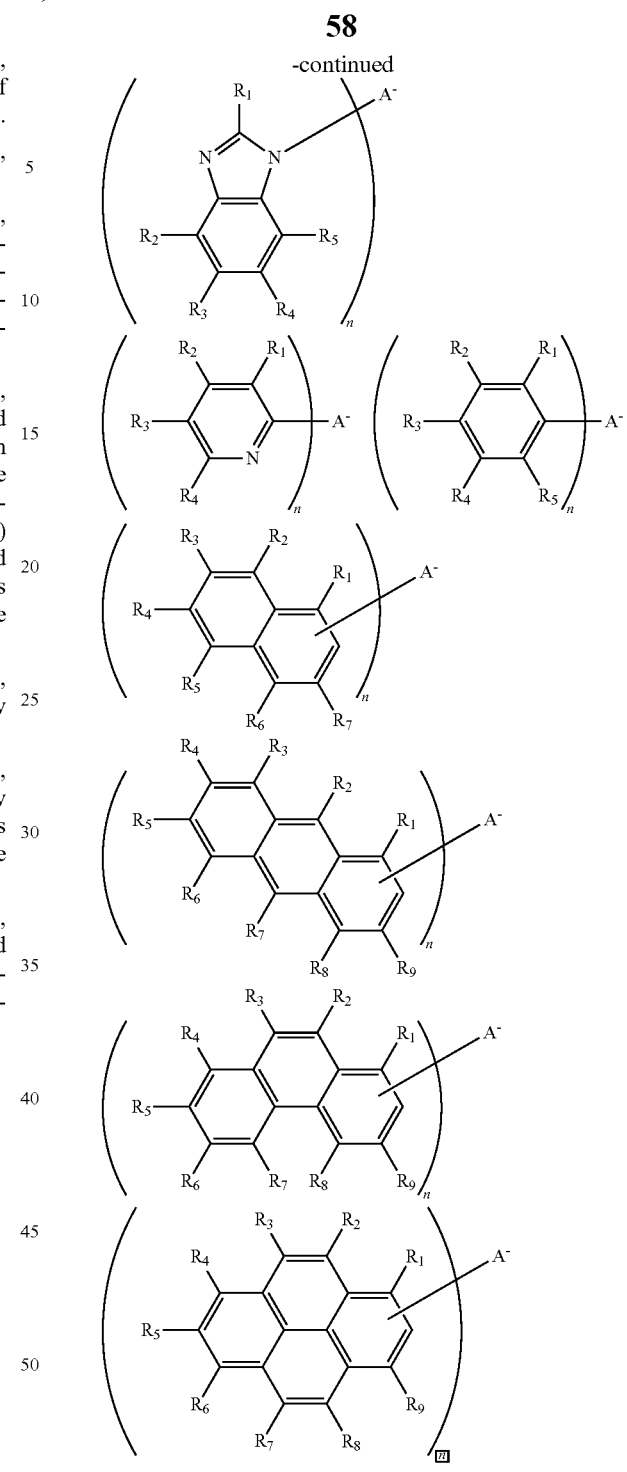

wherein independently, each of $R_1$ to $R_9$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, or antimony; and n is 1 to 6.

Embodiment 25. The device according to embodiment 21, wherein the dopant comprises an ionic compound, and wherein: a cation of the ionic compound is at least one selected from the group consisting of gold, molybdenum, rhenium, iron, and silver; and an anion of the ionic compound is selected from the group consisting of a whole aromatic, a heteroaromatic anion including an optionally substituted tetraarylborate, a halogenatedtetraarylborate, and tetrakispentafluorophenylborate (TPFB).

Embodiment 26. The device according to embodiment 21, wherein the dopant comprises silver tetrakis(pentafluorophenyl)borate.

Embodiment 27. The device according to embodiment 21, wherein the conjugated polymer comprises at least one polythiophene.

Embodiment 28. The device according to embodiment 21, wherein the conjugated polymer comprises at least one polythiophene comprising alkoxy or alkyleneoxy side groups.

Embodiment 29. The device according to embodiment 21, wherein the matrix material comprises matrix material comprises an insulating or semiconducting planarizing agent.

Embodiment 30. The device according to embodiment 21, wherein the composition comprises between about 40% and 75% by weight of the conjugated polymer and between about 25% and 55% by weight of the dopant.

Embodiment 31. A composition comprising: (i) at least one conjugated polymer, wherein the conjugated polymer is a 3-substituted alkoxypolythiophene or a 3,4-substituted dialkoxy polythiophene; (ii) optionally, at least one matrix material different than (i); and (iii) at least one dopant for polymer (i), wherein the dopant does not substantially dope optional matrix material (ii), and the dopant comprises an ionic compound; and (iv) at least one solvent; wherein a cation of the ionic compound is gold, molybdenum, rhenium, iron, or silver; and an anion of the ionic compound is at least one organic structure represented by:

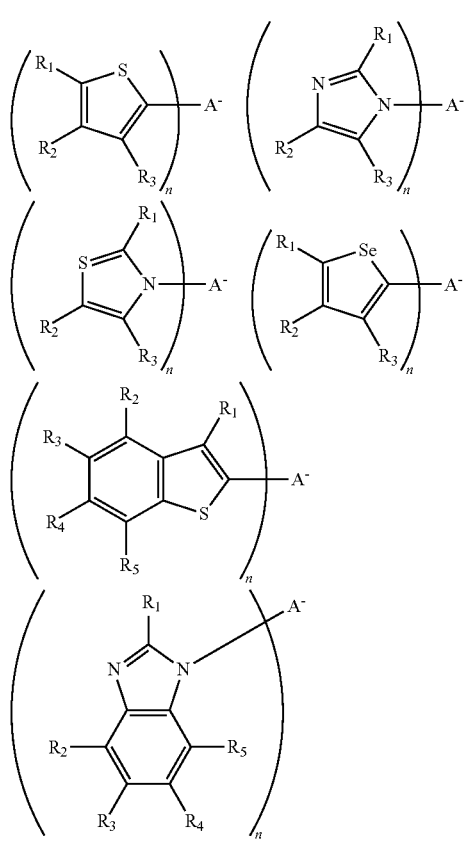

wherein independently, each of $R_1$ to $R_9$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, or antimony; and n is 1 to 6.

Embodiment 32. The composition of embodiment 31, wherein the solvent (iv) comprises THP.

Embodiment 33. The composition of embodiment 31, wherein the solvent (iv) comprises a mixture of 1,2,3,4-tetrahydronaphthalene and 3-methoxypropionitrile.

Embodiment 34. The composition of embodiment 31, wherein the composition comprises between about 40% and 75% by weight of the conjugated polymer and between about 25% and 55% by weight of the dopant.

Embodiment 35. The composition of embodiment 31, wherein the components (i) and (ii) and (iii) are soluble or dispersible in solvent (iv).

Embodiment 36. The composition of embodiment 31, wherein the conjugated polymer comprises poly(3,4-(dibutoxyethoxyethoxy)thiophene).

Embodiment 37. The composition of embodiment 31, wherein the matrix material comprises an insulating or semiconducting planarizing agent.

Embodiment 38. The composition of embodiment 31, wherein the dopant comprises silver tetrakis(pentafluorophenyl)borate.

Embodiment 39. The composition of embodiment 31, wherein the composition comprises at least 95 wt % solvent, and the composition is characterized by a percent solids of 5 wt % or less.

Embodiment 40. The composition of embodiment 31, wherein the composition is formulated to be an HIL layer for a light emitting device.

Embodiment 41. A composition comprising: (i) at least one conjugated polymer, wherein the conjugated polymer is a 3-substituted alkoxypolythiophene or a 3,4-substituted dialkoxy polythiophene; (ii) optionally, at least one matrix material different than (i); and (iii) at least one dopant for polymer (i), wherein the dopant does not substantially dope optional matrix material (ii), and the dopant comprises an ionic compound; and wherein a cation of the ionic compound is gold, molybdenum, rhenium, iron, or silver; and an anion of the ionic compound is at least one organic structure represented by:

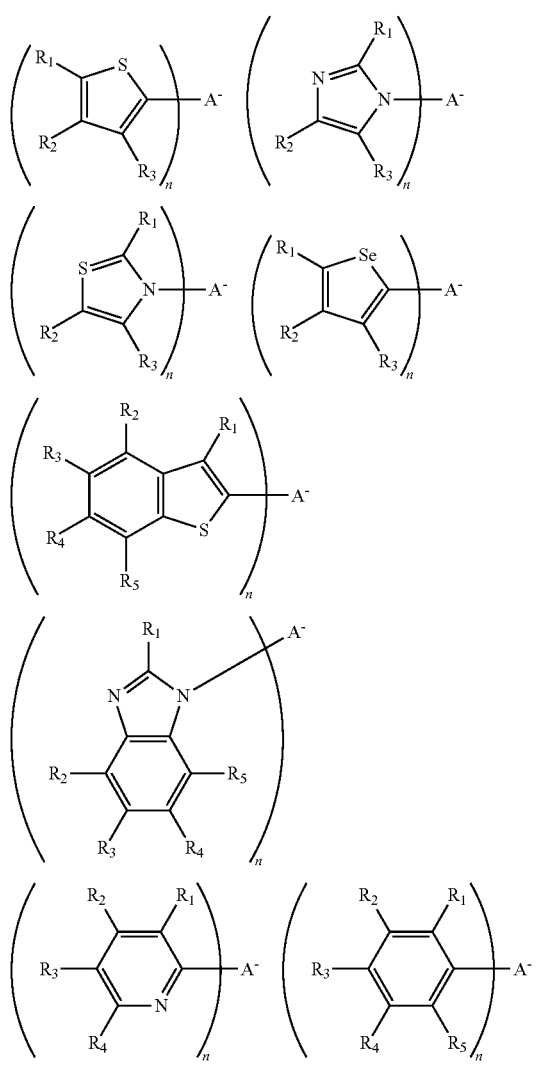

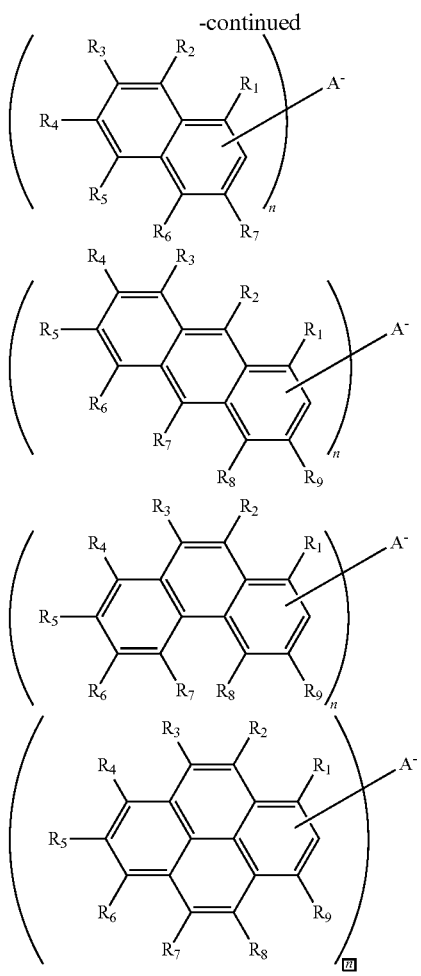

wherein independently, each of $R_1$ to $R_9$ is H, an alkyl, a perfluoroalkyl (C1-C10), a polyether, F, Cl, Br, I, CN, an optionally substituted phenyl, or an optionally substituted naphthyl; "A" is boron, gallium, phosphorous, or antimony; and n is 1 to 6.

Embodiment 42. The composition according to embodiment 41, wherein the dopant comprises an ionic compound; wherein a cation of the ionic compound is gold, molybdenum, rhenium, iron, or silver; and an anion of the ionic compound is a wholly aromatic or heteroaromatic anion including an optionally substituted tetraarylborate, a halogenatedtetraarylborate, or tetrakispentafluorophenylborate (TPFB).

Embodiment 43. The composition according to embodiment 41 wherein the dopant comprises silver tetrakis(pentafluorophenylborate).

Embodiment 44. The composition according to embodiment 41, wherein the conjugated polymer is a 3-substituted alkoxypolythiophene.

Embodiment 45. The composition according to embodiment 41, wherein the conjugated polymer is a 3,4-substituted dialkoxypolythiophene.

Embodiment 46. The composition according to embodiment 41, wherein the conjugated polymer is a regioregular polythiophene.

Embodiment 47. The composition according to embodiment 41, wherein the conjugated polymer is a non-regioregular polythiophene.

Embodiment 48. The composition according to embodiment 41, wherein the matrix material comprises at least one synthetic polymer.

Embodiment 49. The composition according to embodiment 41, wherein the matrix material comprises comprises an insulating or semiconducting planarizing agent.

Embodiment 50. The composition according to embodiment 41, wherein the matrix material comprises at least one of poly(styrene) or poly(styrene) derivatives, poly(vinyl acetate) or derivatives thereof, poly(ethylene glycol) or derivatives thereof, poly(ethylene-co-vinyl acetate), poly(pyrrolidone) or derivatives thereof, poly(1-vinylpyrrolidone-co-vinyl acetate), poly(vinyl pyridine) or derivatives thereof, poly(methyl methacrylate) or derivatives thereof, poly(butyl acrylate), poly(aryl ether ketones), poly(aryl sulfones), poly(aryl ether sulfones), poly(esters) or derivatives thereof.

Embodiment 51. The composition according to embodiment 41, wherein the composition comprises between about 40% and 75% by weight of the conjugated polymer and between about 25% and 55% by weight of the dopant.

Embodiment 52. The composition according to embodiment 41, wherein the composition comprises between about 50% and 65% for the conjugated polymer and between about 35% and 50% of the dopant.

Embodiment 53. The composition according to embodiment 41, wherein the composition is thermally annealed.

Embodiment 54. The composition according to embodiment 41, wherein the composition is thermally annealed at temperature of 90° C. to 170° C. for 5 minutes to 15 minutes.

Embodiment 55. The composition according to embodiment 41, wherein the composition does not comprise iodonium salt.

Embodiment 56. The composition of embodiment 41, wherein the dopant is present in an amount of about 0.3 to 0.5 m/ru, wherein m is the molar amount of dopant and ru is the molar amount of conjugated polymer repeat unit Embodiment 57. The composition of embodiment 41, wherein the composition is a powder and the polymer is a doped.

Embodiment 58. The composition of embodiment 41, wherein the composition is an ink and the polymer is doped.

Embodiment 59. The composition of embodiment 41, wherein the conjugated polymer is represented by:

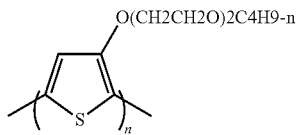

Embodiment 60. The composition of embodiment 41, wherein the polymer is poly(3,4-(dibutoxyethoxyethoxy)thiophene).

Embodiment 61. A device comprising the composition according to embodiment 41.

Embodiment 62. The device of embodiment 61, wherein the device is an LED, an OLED, an OPV, an electrochromic device, a supercapicitor, a battery, an actuator, or a transistor.

Embodiment 63. The device of embodiment 61, wherein the composition is a transparent layer.

Embodiment 64. The device of embodiment 61, wherein the composition is a transparent layer having a transparency of at least 85% to about 100% at 400-800 nm wavelength.

Embodiment 65. A coated substrate comprising at least one substrate and at least one coating disposed on the substrate, wherein the coating comprises the composition of embodiment 41.

Embodiment 66. The coated substrate of embodiment 65, wherein the coating is patterned or unpatterned.

Embodiment 67. The coated substrate of embodiment 65, wherein the coating is patterned.

This concludes embodiments 1-67 provided in U.S. provisional Ser. No. 61/333,657 filed May 11, 2010.

Priority U.S. provisional application Nos. 61/333,657 filed May 11, 2010 and 61/446,974 filed Feb. 25, 2011 are hereby incorporated by reference in their entireties for all purposes.

What is claimed is:

1. A composition comprising: a reaction product of (i) at least one hole transport material, and (ii) at least one silver tetrakis(halogenatedaryl)borate dopant.

2. A composition according to claim 1, wherein the silver tetrakis(halogenatedaryl)borate dopant is silver tetrakis(pentafluorophenyl)borate dopant.

3. The composition according to claim 1, wherein the hole transport material is a polymer.

4. The composition according to claim 1, wherein the hole transport material is a polymer, wherein the polymer is a conjugated polymer or an arylamine polymer, or wherein the polymer is a main chain or side chain hole transporting polymer.

5. The composition according to claim 1, wherein the hole transport material is a conjugated polymer.

6. The composition of claim 1, wherein the hole transport material is a polythiophene.

7. The composition according to claim 1, wherein the hole transport material is a regioregular polythiophene.

8. The composition according to claim 1, wherein the hole transport material is a conjugated polymer comprising at least one polythiophene comprising an alkoxy substituent at either the 3-position or the 4 position or both.

9. The composition according to claim 1, wherein the composition further comprises a matrix material.

10. The composition according to claim 1, wherein the composition further comprises at least one synthetic organic polymer as matrix material.

11. The composition according to claim 1, wherein the composition further comprises at least one synthetic organic polymer as matrix material, wherein the polymer is an insulating or semiconducting polymer.

12. The composition according to claim 1, wherein the reaction product is a product of between about 40% and 75% by weight hole transport material and between about 25% and 55% by weight dopant.

13. The composition according to claim 1, wherein the reaction product is a product of between about 50% and 65% by weight hole transport material and between about 35% and 50% by weight dopant.

14. The composition according to claim 1, wherein the composition is in the form of a solid powder or is dissolved or dispersed in a solvent ink carrier.

15. The composition of claim 1, wherein the composition is a solid powder.

16. The composition according to claim 1, wherein the composition is dissolved or dispersed in a solvent ink carrier without thermal or photo treatment to induce reaction.

17. The composition according to claim 1, wherein the composition is dissolved or dispersed in a solvent ink carrier which comprises at least one of toluene, xylene(s), tetralene, mesitylene, phenetole, 4-methylanisole, anisole, tetrahydropyran, 3-methoxypropionitrile, 3-ethoxypropionitrile, methyl benzoate, ethyl benzoate, propyleneglycolmethyl ether acetate, 1,2-dimethoxyethane, diethyleneglycoldiethylether, and combinations thereof.

18. The composition according to claim 1, wherein the composition is dissolved or dispersed in a solvent ink carrier which comprises THP, anisole, dimethoxyethane, ethylbenzoate.

19. The composition according to claim 1, wherein the composition has a zero valent metal content of 0.5 wt. % or less.

20. The composition according to claim 1, wherein the composition is substantially free of zero valent metal.

21. The composition of claim 1, comprising at least one solid powder, wherein the solid powder comprises said reaction product.

22. The composition according to claim 21, wherein the hole transport material is a conjugated polymer.

23. The composition of claim 21, wherein the hole transport material is a polythiophene.

24. The composition according to claim 21, wherein the silver tetrakis(halogenatedaryl)borate dopant is silver tetrakis(pentafluorophenyl)borate.

25. The composition according to claim 21, wherein the composition is substantially free of zero valent metal.

26. A device comprising the composition of claim 1, wherein the device is an OLED, OPV, transistor, sensor, capacitor, or battery device.

27. An ink composition comprising the composition of claim 1 and a solvent carrier.

28. A device comprising at least one cathode, at least one anode, at least one light emission layer disposed between the cathode and anode, at least one hole injection layer between the light emission layer and the anode or cathode, wherein the hole injection layer comprises a composition according to claim 1.

29. The device of claim 28, wherein the device is an OLED or OPV device.

30. The device of claim 28, wherein the device is an OLED device.

31. The device of claim 28, wherein the device further comprises a hole transport layer.

32. The device according to claim 28, wherein the HIL layer has a thickness of about 5 nm to about 500 nm.

33. The device according to claim 28, wherein the HIL layer has a thickness of about 5 nm to about 150 nm.

34. The device according to claim 28, wherein the HIL layer has a thickness of about 20 nm to about 100 nm.

35. The device according to claim 28, wherein the HIL layer is thermally annealed.

36. The device according to claim 28, wherein the HIL layer is thermally annealed at temperature of about 25° C. to about 250° C.

37. The device according to claim 28, wherein the HIL layer is thermally annealed at temperature of about 25° C. to about 250° C. and at reduced pressures of $10^{-6}$ to 760 torr.

38. The device according to claim 28, wherein the HIL layer is thermally annealed at temperature of about 90° C. to about 170° C. for about 5 to about 15 minutes.

39. The device according to claim 28, wherein the HIL layer is heated to remove solvent.

40. The device according to claim 28, wherein the HIL layer does not comprise iodonium salt.

* * * * *